(12) United States Patent
Lunt et al.

(10) Patent No.: US 12,027,325 B2
(45) Date of Patent: Jul. 2, 2024

(54) UV HARVESTING TRANSPARENT PHOTOVOLTAICS

(71) Applicant: Board of Trustees of Michigan State University, East Lansing, MI (US)

(72) Inventors: Richard R. Lunt, Williamston, MI (US); Dianyi Liu, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 343 days.

(21) Appl. No.: 16/960,461

(22) PCT Filed: Jan. 9, 2019

(86) PCT No.: PCT/US2019/012840
§ 371 (c)(1),
(2) Date: Jul. 7, 2020

(87) PCT Pub. No.: WO2019/139945
PCT Pub. Date: Jul. 18, 2019

(65) Prior Publication Data
US 2020/0343053 A1 Oct. 29, 2020

Related U.S. Application Data

(60) Provisional application No. 62/615,283, filed on Jan. 9, 2018.

(51) Int. Cl.
*H01G 9/20* (2006.01)
*H10K 30/82* (2023.01)
(52) U.S. Cl.
CPC ........... *H01G 9/2009* (2013.01); *H10K 30/82* (2023.02)

(58) Field of Classification Search
CPC ........................... H01G 9/2009; H01L 51/442
See application file for complete search history.

(56) References Cited

U.S. PATENT DOCUMENTS 4,293,732 A * 10/1981 Rancourt .......... H01L 31/02168
359/359
6,297,442 B1 * 10/2001 Yagi ................ H01L 31/022466
136/258

(Continued)

FOREIGN PATENT DOCUMENTS

JP 2000208800 A 7/2000
JP 2012186130 A 9/2012

(Continued)

OTHER PUBLICATIONS

Gujar et al., The role of PbI2 in CH3NH3Pbi3 perovskite stability, solar cell parameters and device degradation, Physical Chemistry, vol./issue 20, pp. 605-614, first published online Nov. 21, 2017 (Year: 2018).*

(Continued)

*Primary Examiner* — Jayne L Mershon
(74) *Attorney, Agent, or Firm* — Harness, Dickey & Pierce, PLC

(57) ABSTRACT

A transparent photovoltaic cell is provided. The transparent photovoltaic cell includes a first visibly transparent electrode, a visibly transparent active layer including a light absorbing material that has a bandgap greater than or equal to about 2.75 eV, and a second visibly transparent electrode. The active layer is disposed between the first transparent electrode and the second transparent electrode. The transparent photovoltaic cell is visibly transparent.

38 Claims, 19 Drawing Sheets

(56) References Cited

U.S. PATENT DOCUMENTS

| | | | | |
|---|---|---|---|---|
| 2002/0189666 A1* | 12/2002 | Forrest | ............... | H01L 51/424 |
| | | | | 257/E31.003 |
| 2011/0220194 A1* | 9/2011 | Kurtin | ............... | C09K 11/02 |
| | | | | 136/256 |
| 2013/0240027 A1* | 9/2013 | Zakhidov | ............ | H01L 27/302 |
| | | | | 136/255 |
| 2016/0013433 A1* | 1/2016 | Yang | ............... | H01L 51/424 |
| | | | | 47/17 |
| 2016/0141535 A1* | 5/2016 | Snaith | ............... | H01L 51/424 |
| | | | | 438/82 |
| 2017/0089128 A1* | 3/2017 | Wheeler | ............... | C03C 4/06 |
| 2018/0366648 A1* | 12/2018 | Barr | ............... | H10K 85/361 |
| 2019/0008242 A1* | 1/2019 | Gapp | ............... | H03K 17/962 |

FOREIGN PATENT DOCUMENTS

| WO | WO-2012121937 A1 | 9/2012 |
|---|---|---|
| WO | WO-2016151535 A1 | 9/2016 |
| WO | WO-2017/075472 A1 | 5/2017 |

OTHER PUBLICATIONS

Wang et al., Credible evidence for the passivation effect of remnant Pbl2 in CH3NH3Pbl3 films in improving hte performance of perovskite solar cells, Royal Society of Chemistry, Nanoscale, vol./issue 8, pp. 6600-6608 (Year: 2016).*

Jeong et al., Low Resistance and Highly Transparent Ito-Ag-ITO multilayer electrode using surface plasmon resonance of Ag layer for bulk-heterojunction organic solar cells, Solar Energy Materials & Solar Cells, vol./Issue 93, pp. 1801-1809 (Year: 2009).*

Castelli et al., Bandgap calculations and trends of organometal halide perovskites, IA/issuePL Maerials, vol./Issue 2, Aug. 15, 2014, pp. 1-7 (Year: 2014).*

McLaughlin et al., Progress in Indium Gallium Nitride Materials for Solar Photovoltaic Energy Conversion, Metallurgical and Materials Transactions A, vol. 44, pp. 1947-1954 (Year: 2013).*

Liu et al., Lead Halide Ultraviolet-Halide Transparent Photovoltaics with an Efficinecy Exceeding 1%, ACS Applied Energy Materials, Issue/vol. 2, pp. 3972-3978 (Year: 2019).*

Office Action regarding Japanese Patent Application No. 2020-557141, dated Nov. 2, 2021. Translation provided by Harakenzo World Patent and Trademark.

International Search Report and Written Opinion of the International Searching Authority, issued in PCT/US2019/012840, mailed Mar. 25, 2020; ISA/US.

Extended European Search Report for Application for EP Application 19738009.0 dated Aug. 26, 2021.

Office Action regarding Japanese Patent Application No. 2020-557141, dated Jul. 5, 2022. Translation provided by Harakenzo World Patent and Trademark.

Chinese Office Action regarding CN Application 2019800182706 dated Jan. 4, 2024 with English language translation.

* cited by examiner

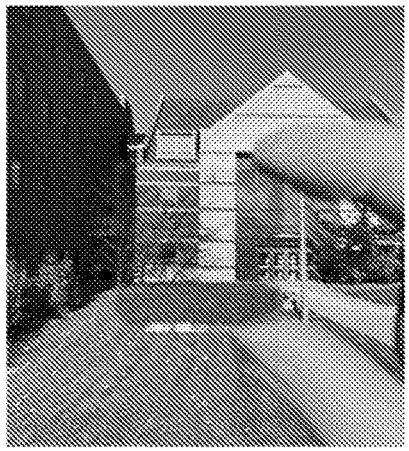
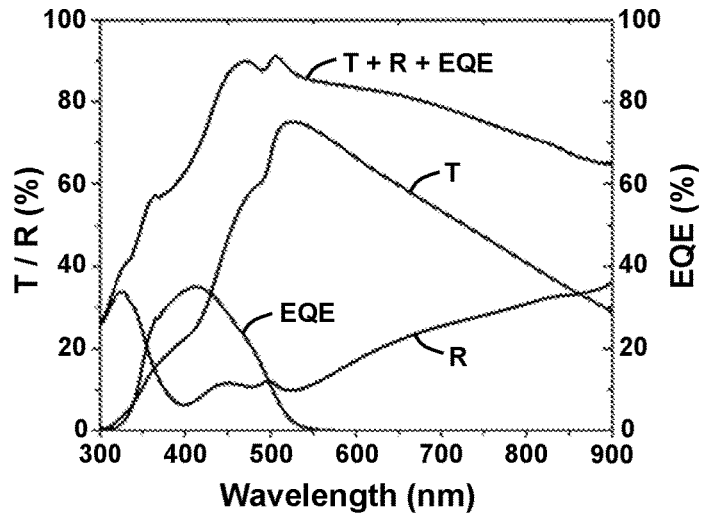
Fig. 21A  Fig. 21B
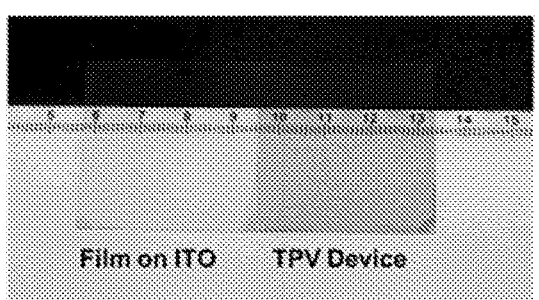
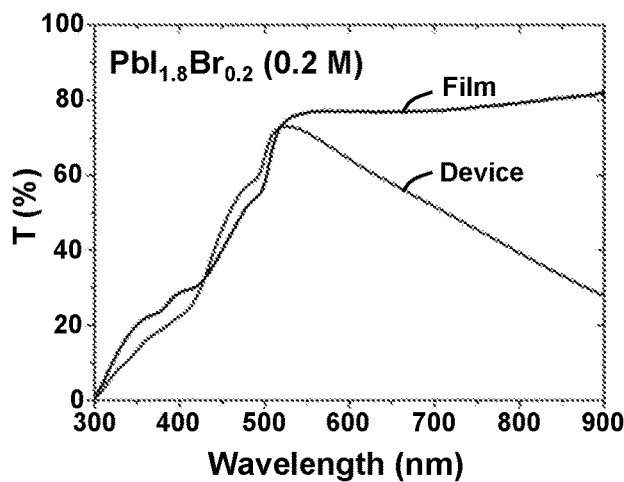
Fig. 22A  Fig. 22B

UV HARVESTING TRANSPARENT PHOTOVOLTAICS

CROSS-REFERENCE TO RELATED APPLICATIONS

This application is a 371 U.S. National Phase of International Application No. PCT/US2019/012840, filed Jan. 9, 2019, which claims the benefit of U.S. Provisional Application No. 62/615,283, filed on Jan. 9, 2018. The entire disclosures of the above applications are incorporated herein by reference.

GOVERNMENT RIGHTS

This invention was made with government support under 1807573 awarded by the National Science Foundation. The government has certain rights in the invention.

FIELD

The present disclosure relates to ultraviolet (UV) harvesting transparent photovoltaics.

BACKGROUND

This section provides background information related to the present disclosure which is not necessarily prior art.

Transparent photovoltaic (TPV) technologies offer an effective approach to produce smart windows on buildings, vehicles, and greenhouses. TPVs can both regulate the transmission of solar heat and provide electricity generation by photoelectron conversion of the invisible part of the solar spectrum. Often, the most critical parameter in determining the adoptability of TPVs is the overall average visible transparency (AVT), since aesthetic demands place strict requirements for applications in mobile electronics and windows. To achieve the highest combination of transparency and efficiency requires selectively harvesting all of the invisible parts of the solar spectrum, including the near-infrared and ultraviolet, resulting in efficiency limits up to 20.1% and record efficiencies now around 5% for AVTs greater than 50%.

While there is substantially less overall solar photon flux in the ultraviolet, efficiencies up to 7% are theoretically achievable. The approach of selectively harvesting UV-only photons can allow very high photovoltages (greater than 1.5 V) and enable integration of more traditional semiconductors such as GaN, ZnO, and NiO. To date, only a few UV harvesting TPV devices have been reported. For example, a semi-transparent NiO/ZnO UV photovoltaic cell with a power conversion efficiency (PCE) of 0.1% has been reported, where the larger bandgap (3.3 eV) limits the efficiency significantly. More recently, UV-harvesting organic TPVs have also been demonstrated with a PCE of up to 1.5% with an AVT of 60%, but with visible bandgaps about 2.4 eV. These early studies are encouraging and demonstrate good potential for TPV applications, but will ultimately have limited potential for additional optimization due to bandgaps far from the ideal cutoff.

Because this UV-harvesting approach can enable the use of continuous band absorbing semiconductors, it also offers a great untapped opportunity for halide perovskites, which are now being considered as replacements for Si, CdTe, and GaAs. Halide perovskite materials have emerged as a strong light harvest candidate with excellent photovoltaic properties, high quantum efficiencies, and a certified efficiency up to 22.7%. Perovskite materials are also among the cheapest light absorption semiconductor materials with readily tunable bandgap through compositional control. Accordingly, TPV devices made from perovskite materials are desirable.

SUMMARY

This section provides a general summary of the disclosure, and is not a comprehensive disclosure of its full scope or all of its features.

In various aspects, the current technology provides a transparent photovoltaic cell including a first visibly transparent electrode; a visibly transparent active layer including a light absorbing material that has a bandgap greater than or equal to about 2.75 eV; and a second visibly transparent electrode, wherein the active layer is disposed between the first transparent electrode and the second transparent electrode, and wherein the transparent photovoltaic cell is visibly transparent.

In one aspect, the light absorbing material has a bandgap greater than or equal to about 2.75 eV and less than or equal to about 3.2 eV.

In one aspect, the light absorbing material absorbs ultraviolet (UV) light having a wavelength of less than or equal to about 450 nm.

In one aspect, the light absorbing material is substantially nonabsorbent to light having a wavelength of greater than or equal to about 450 nm.

In one aspect, the transparent photovoltaic cell reflects greater than or equal to about 10% of light having wavelengths of greater than or equal to about 650 nm to less than or equal to about 5000 nm.

In one aspect, the light absorbing material is a halide perovskite.

In one aspect, the halide perovskite includes halide perovskite nanocrystals.

In one aspect, the halide perovskite has the formula $ABX_3$, where A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X is a halide or a combination of halides.

In one aspect, the halide perovskite includes F, Cl, Br, and I and a bandgap of greater than or equal to about 2.75 eV to less than or equal to about 3.2 eV.

In one aspect, the halide perovskite includes Cl and at least one other halide.

In one aspect, the light absorbing material is a metal halide, a metal nitride, a metal sulfide, a metal selenide, a metal telluride, an alloy thereof, or a combination thereof.

In one aspect, the metal halide includes at least one of $PbI_2$, $PbCl_2$, $PbBr_2$, $PbI_xBr_{(1-x)}$, $PbI_xCl_{(1-x)}$, $PbBr_xCl_{(1-x)}$, $SnI_2$, $SnCl_2$, $SnBr_2$, $SnI_xBr_{(1-x)}$, $SnI_xCl_{(1-x)}$, $SnBr_xCl_{(1-x)}$, $GeI_2$, $GeCl_2$, $GeBr_2$, $GeI_xBr_{(1-x)}$, $GeI_xCl_{(1-x)}$, $GeBr_xCl_{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI_3$, $A_2TiI_6$, $A_2TiCl_6$, and $A_2TiBr_6$, where A is an alkali metal (Li, Na, K, Rb, Cs, or a combination thereof), an organic cation (methylammonium (MA), formamidinium (FA), ethanediammonium (EA), iso-propylammonium, dimethylammonium, guanidinium, piperidinium, pyridinium, pyrrolidinium, imidazolium, t-butylammonium or a combination thereof), or a combination thereof, and $0 \leq x \leq 1$; the metal nitride includes at least one of $In_{(x)}Ga_{(1-x)}N$ and $In_{(x)}Al_{(1-x)}N$, where $0 \leq x \leq 1$; the metal sulfide includes $ZnS_{(x)}Se_{(1-x)}$, where $0 \leq x \leq 1$; the metal selenide includes at least one of ZnSe, $ZnO_{(X)}Se_{(1-X)}$, and $Zn_{(X)}Mg_{(1-X)}Se$, where $0 \leq x \leq 1$; and the metal telluride includes at least one of $Zn_{(X)}Mg_{(1-X)}Te$ and $BeSe_{(X)}Te_{(1-X)}$, where $0 \leq x \leq 1$.

In one aspect, the transparent photovoltaic cell transmits visible light and has an average visible transparency of greater than or equal to about 45%.

In one aspect, the transparent photovoltaic cell has a color rendering index of greater than about 80 referenced to an air mass 1.5 global (AM 1.5 G) solar spectrum.

In one aspect, the first visibly transparent electrode is a visibly transparent anode and the second visibly transparent electrode is a visibly transparent cathode.

In one aspect, the transparent photovoltaic cell further includes an adjunct layer disposed between the first visibly transparent electrode and the visibly transparent active layer, wherein the adjunct layer is an electron transport layer, an electron extraction layer, a hole blocking layer, or a buffer layer.

In one aspect, the adjunct layer includes poly(3,4-ethylenedioxythiophene) polystyrene sulfonate (PEDOT:PSS), poly(3-hexylthiophene-2,5-diyl) (P3HT), N,N'-Bis(naphthalen-1-yl)-N,N'-bis(phenyl)-2,2'-dimethylbenzidine (NPD), N,N'-Bis(3-methylphenyl)-N,N'-bis(phenyl)-benzidine (TPD), 2,2',7,7'-Tetrakis(N,N-diphenylamino)-2,7-diamino-9,9-spirobifluorene(spiro-TAD), Poly[N,N'-bis(4-butylphenyl)-N,N'-bis(phenyl)-benzidine] (poly-TPD), or a combination thereof.

In one aspect, the transparent photovoltaic cell further includes an adjunct layer disposed between first the visibly transparent active layer and the second visibly transparent electrode, wherein the adjunct layer is an electron transport layer or an electron extraction layer.

In one aspect, the adjunct layer includes at least one of a fullerene, ZnO, $TiO_2$, NiO, $MoO_3$, a conductive nanotube, and a conductive nanoparticle.

In one aspect, the transparent photovoltaic cell further includes an adjunct layer disposed between the visibly transparent active layer and the second visibly transparent electrode, wherein the adjunct layer is an electron transport layer or an electron extraction layer that provides an ohmic contact between the visibly transparent active layer and the second visibly transparent electrode.

In one aspect, the adjunct layer includes [6,6]-phenyl-C61-butyric acid methyl ester (PCBM), Al-doped ZnO (AZO), $TiO_2$, bathocuproine (BCP), $MoO_3$, or a combination thereof.

In one aspect, the second visibly transparent electrode includes a transparent conducting oxide, a nanowire mesh, conducting oxide nanoparticles, conductive nanotubes, a thin metal layer, or a combination thereof.

In one aspect, the second visibly transparent electrode includes a thin metal layer having silver (Ag) and a conductive layer having aluminum tris(8-hydroxyquinolinate) ($Alq_3$) or indium tin oxide (ITO), wherein the thin metal layer is disposed between the visibly transparent active layer and the conductive layer.

In one aspect, the transparent photovoltaic cell further includes a visibly transparent substrate disposed on the first visibly transparent electrode, wherein the visibly transparent substrate includes glass, a rigid polymer, or a flexible polymer.

In one aspect, the transparent photovoltaic cell has a power conversion efficiency greater than or equal to about 0.3%.

In one aspect, the transparent photovoltaic cell has an external quantum efficiency at any wavelength less than about 450 nm of greater than or equal to about 20%.

In one aspect, the transparent photovoltaic cell does not include an additional active layer having a bandgap of less than 2.75 eV.

In one aspect, the transparent photovoltaic cell does not include an additional active layer with an external quantum efficiency greater than about 10% at wavelengths greater than about 450 nm.

In various aspects, the current technology provides a transparent photovoltaic cell including a substrate; a first electrode; an active layer including a light absorbing material that only absorbs ultraviolet (UV) light having a wavelength of less than about 450 nm, the light absorbing material being either a halide perovskite, or a metal halide, a metal nitride, a metal sulfide, a metal selenide, a metal telluride, an alloy thereof, or a combination thereof; and a second electrode wherein the first electrode is located between the substrate and the active layer and the active layer is located between the first electrode and the second electrode, and wherein each of the substrate, the first electrode, the active layer, and the second electrode are visibly transparent, such that the transparent photovoltaic cell has an average visible transparency of greater than or equal to about 50%.

In one aspect, the transparent photovoltaic cell further includes a visibly transparent adjunct layer located between the active layer and the second electrode, wherein the adjunct layer is an electron transport layer or an electron extraction layer including at least one of a fullerene, ZnO, $TiO_2$, NiO, $MoO_3$, a conductive nanotube, and a conductive nanoparticle.

In one aspect, the transparent photovoltaic cell further includes a first visibly transparent adjunct layer located between the first electrode and the active layer; and a second visibly transparent adjunct layer located between the active layer and the second electrode, wherein the first visibly transparent adjunct layer is an electron transport layer, an electron extraction layer, a hole blocking layer, or a buffer layer, and the second visibly transparent adjunct layer is an electron transport layer or an electron extraction layer.

In one aspect, the transparent photovoltaic cell, further includes a third visibly transparent adjunct layer located between the second visibly transparent adjunct layer and the second electrode, wherein the third visibly transparent adjunct layer is an electron transport layer or an electron extraction layer that provides an ohmic contact between the second visibly transparent adjunct layer and the second electrode.

In one aspect, the second electrode includes a first layer having a material selected from the group including indium tin oxide (ITO), aluminum doped zinc oxide (AZO), fluorine doped tin oxide (FTO), indium zinc oxide, InZnAlO, zinc oxide, ZnAlO (ZAO), cadmium oxide, zirconium indium oxide (ZrIO), gallium zinc oxide (GZO), Al, Au, Ag, Mo, Cu, Ni, graphene, graphene oxide, poly(3,4-ethylenedioxythiophene) polystyrene sulfonate (PEDOT:PSS), metal nanowires, and combinations thereof; and a second layer including aluminum tris(8-hydroxyquinolinate) ($Alq_3$), 4,4'-Bis(N-carbazolyl)-1,1'-biphenyl (CBP), N,N'-Di(1-naphthyl)-N,N'-diphenyl-(1,1'-biphenyl)-4,4'-diamine (NPD), 2,2',7,7'-Tetrakis[N,N-di(4-methoxyphenyl)amino]-9,9'-spirobifluorene, N,N'-Bis(3-methylphenyl)-N,N'-bis(phenyl)-benzidine (TPD), a derivative thereof, or a combination thereof, wherein the first layer is disposed between the active layer and the second layer.

In various aspects, the current technology provides a transparent photovoltaic cell including a first visibly transparent electrode; a second visibly transparent electrode; and a visibly transparent active layer disposed between the first visibly transparent electrode and the second visibly transparent electrode, the active layer including a light absorbing material that only absorbs light having a wavelength of less than about 450 nm and that is substantially nonabsorbent to light having a wavelength of greater than or equal to about 450 nm, wherein the light absorbing material is either a halide perovskite having the formula $ABX_3$, where A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X is a halide or a combination of halides, or a metal halide including at least one of $PbI_2$, $PbCl_2$, $PbBr_2$, $PbI_xBr_{(1-x)}$, $PbI_xCl_{(1-x)}$, $PbBr_xCl_{(1-x)}$, $SnI_2$, $SnCl_2$, $SnBr_2$, $SnI_xBr_{(1-x)}$, $SnI_xCl_{(1-x)}$, $SnBr_xCl_{(1-x)}$, $GeI_2$, $GeCl_2$, $GeBr_2$, $GeI_xBr_{(1-x)}$, $GeI_xCl_{(1-x)}$, $GeBr_xCl_{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI_3$, $A_2TiI_6$, $A_2TiCl_6$, and $A_2TiBr_6$, where A is an alkali metal (Li, Na, K, Rb, Cs, or a combination thereof), an organic cation (methylammonium (MA), formamidinium (FA), ethanediammonium (EA), iso-propylammonium, dimethylammonium, guanidinium, piperidinium, pyridinium, pyrrolidinium, imidazolium, t-butylammonium or a combination thereof), or a combination thereof, a metal nitride including at least one of $In_{(x)}Ga_{(1-x)}N$ and $In_{(x)}Al_{(1-x)}N$, a metal sulfide including $ZnS_{(x)}Se_{(1-x)}$, a metal selenide including at least one of ZnSe, $ZnO_{(x)}Se_{(1-x)}$, and $Zn_{(x)}Mg_{(1-x)}Se$, a metal telluride including at least one of $Zn_{(x)}Mg_{(1-x)}Te$ and $BeSe_{(x)}Te_{(1-x)}$, an alloy thereof, or a combination thereof, and wherein $0 \geq x \geq 1$.

In one aspect, the transparent photovoltaic cell is a rigid display screen, a flexible display screen, a watch crystal, an automotive glass, a smart window, an autonomous electrochromic window, or an architectural glass.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 21A is a photograph of a fully assembled (unpatterned) $PbI_{1.8}Br_{0.2}$ TPV device.

FIG. 21B shows transmission (T), reflection (R), and external quantum efficiency (EQE) spectra of the $PbI_{1.8}Br_{0.2}$ TPV device shown in FIG. 21A.

FIG. 22A is a photograph of a $PbI_{1.8}Br_{0.2}$ film and of a TPV device prepared by 0.2 M $PbI_{1.8}Br_{0.2}$ precursor solutions.

FIG. 22B shows transmission spectra of the film and TPV device shown in FIG. 22A.

Corresponding reference numerals indicate corresponding parts throughout the several views of the drawings.

DETAILED DESCRIPTION

Figure 1:
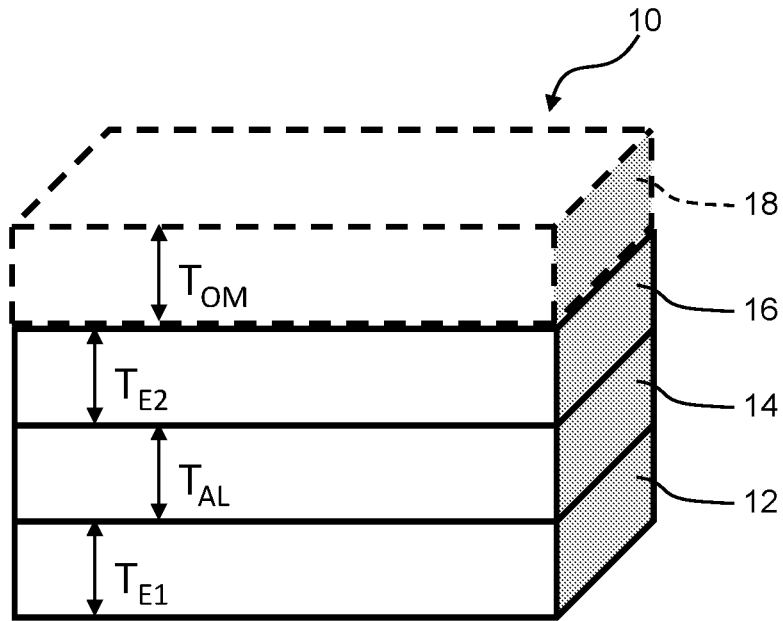
FIG. 1 is an illustration of a first device according to various aspects of the current technology.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from A to B" or "from about A to about B" is inclusive of A and B.

Example embodiments will now be described more fully with reference to the accompanying drawings.

The current technology provides transparent solar cell designs, e.g., transparent photovoltaic devices (TPV). The term transparent as used herein encompasses an average visible transparency of a straight through beam of greater than or equal to about 45%. The term semi-transparent as used herein encompasses an average visible transparency of a straight through beam of greater than or equal to about 10% to less than or equal to about 45%. In general, the designs include molecular active layers with strong absorption features outside of the visible light spectrum, e.g., in the ultraviolet (UV) solar spectrum. The devices may include selective high-reflectivity anti-reflection contact coatings. Devices may be formed as heterojunction solar cells with a second light absorbing layers having peak-absorption in the ultraviolet (UV) solar spectrum. Whereas the second light absorbing material absorbs UV light, it is substantially nonabsorbent (as defined below) to light having a wavelength of greater than or equal to about 450 nm, greater than or equal to about 475 nm, or greater than or equal to about 500 nm. Such devices may be formed in a tandem structure with one or more subcells joined via a recombination zone. Such devices may be used in a variety of applications including rigid and flexible computer display screens used in a desktop monitor, laptop or notebook computer, tablet computer, mobile phone, e-reader and the like. Other applications include watch crystals, automotive and architectural glass, including sunroofs, smart windows, autonomous electrochromic windows, and privacy glass. The photovoltaic devices may be used for active power generation, e.g., for completely self-powered applications, and battery charging (or battery life extension).

Near-infrared (NIR) as recited herein is defined as light having wavelengths in the range of greater about 650 to less than or equal to about 2000 nanometers (nm). Ultraviolet (UV) as recited herein is defined as light having wavelengths of greater than about 10 nm and less than about 450 nm. The use of an active layer having absorption in the UV allows for the use of selective high-reflectivity coatings to optimize device performance while also permitting high transmission of visible light through the entire device. Visible light as recited herein is defined as light having wavelengths to which the human eye has a significant response, from greater than or equal to about 450 nm to less than or equal to about 650 nm.

Halide perovskite materials have emerged as a Si replacement with excellent photovoltaic properties, certified efficiency up to 22.7%, and extremely low cost. There has been growing interest in applying halide perovskites to semitransparent and spatially segmented transparent photovoltaics (TPVs) to enable a greater range of deployment routes. However, the continuous band absorption of these semiconductors prevents near-infrared selective wavelength harvesting typically targeted for transparent photovoltaics (TPVs) with the highest efficiency and highest transparency needed to meet the aesthetic demands of many emerging applications. The current technology provides for the development of TPVs based on perovskite semiconductors where the bandgap is sensitively tuned with a key range of compositions to selectively harvest only ultraviolet (UV) photons with bandgaps between 400-440 nm. This range is important because bandgaps less than about 380 nm have much lower theoretical efficiency limits of less than 2.5% and bandgaps greater than about 450 nm will impart unacceptable levels of color tinting or poor color rendering index (CRI). TPV devices are demonstrated with power conversion efficiency (PCE) up to 0.52%, average visible transparency (AVT) up to 70.7%, and CRI over 92. This approach offers theoretical efficiencies up to 7% with 100% visible transparency and CRIs greater than about 90. Practical optimization of these perovskite cells, currently limited by quantum efficiencies of only 20-30%, could quickly yield TPVs with PCEs between 3-5%, rivaling state of the art near-infrared-harvesting TPVs, while also providing a route to higher efficiency multi-junction TPVs when coupled with near-infrared harvesting TPVs.

An exemplary transparent photovoltaic cell 10 according to various aspects of the current technology is shown in FIG. 1. The transparent photovoltaic cell 10 comprises a first electrode 12, an active layer 14 comprising a light absorbing material that has a bandgap of greater than or equal to about 2.75 eV, and a second electrode 16. Each of the first electrode 12, the active layer 14, and the second electrode 16 are visibly transparent. The active layer 14 is disposed between the first electrode 12 and the second electrode 16.

As discussed further below, the transparent photovoltaic cell 10 can comprise more than one active layer 14 in various embodiments. Such active layers 14 have a bandgap of greater than or equal to about 2.75 eV or have an external quantum efficiency of less than 10% at wavelengths greater than about 450 nm. Put another way, the transparent photovoltaic cell 10 does not include an additional active layer having a bandgap of less than 2.75. Alternatively, the transparent photovoltaic cell 10 does not include an additional active layer that generates an external quantum efficiency greater than about 10% at wavelengths greater than about 450 nm.

In various embodiments, the light absorbing material has a bandgap greater than or equal to about 2.75 eV and less than or equal to about 3.2 eV. For example, in various embodiments the light absorbing material has a bandgap of about 2.75 eV, about 2.8 eV, about 2.85 eV, about 2.9 eV, about 2.95 eV, about 3 eV, about 3.05 eV, about 3.1 eV, about 3.15 eV, or about 3.2 eV. Accordingly, the light absorbing material absorbs UV light having a wavelength of less than or equal to about 470 nm, less than or equal to about 460 nm, less than or equal to about 450 nm, less than or equal to about 440 nm, less than or equal to about 430 nm, less than or equal to about 420 nm, less than or equal to about 410 nm, or less than or equal to about 400 nm.

Whereas the light absorbing material absorbs UV light, it is substantially nonabsorbent to light having a wavelength of greater than or equal to about 450 nm, greater than or equal to about 460 nm, or greater than or equal to about 470 nm. By "substantially nonabsorbent" it is meant that the light absorbing material absorbs less than or equal to about 25%, less than or equal to about 20%, less than or equal to about 15%, less than or equal to about 10%, less than or equal to about 5%, or less than or equal to about 1% of the light having a wavelength greater than or equal to about 450 nm, greater than or equal to about 460 nm, or greater than or equal to about 470 nm. For example, in some embodiments the light absorbing material may have a peak absorption at a wavelength of less than about 450 nm, but which tails off into the visible region at a wavelength of greater than about 450 nm and beyond. In such an embodiment, it is understood that the light absorbing material absorbs some visible light that is associated with the tail. Further, transparent photovoltaic cell 10, as fully assembled, has a largest peak absorption in the active layer at a wavelength less than or equal to about 450 nm.

The transparent photovoltaic cell 10 is transparent. As such, the transparent photovoltaic cell 10 transmits visible light and has an average visible transparency (AVT) of greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, or greater than or equal to about 90%. Further, the transparent photovoltaic cell 10 has a CRI of greater than or equal to about 80, greater than or equal to about 85, greater than or equal to about 90, or greater than or equal to about 95, referenced to an air mass 1.5 global (AM 1.5 G) solar spectrum. Therefore, in various embodiments, the transparent photovoltaic cell 10 is visibly transparent, such that when a human observer looks through the transparent photovoltaic cell 10, objects on an opposing side of the transparent photovoltaic cell 10 than the human observer appear substantially (or completely) in their natural color and substantially without (or without) tint or haze.

The transparent photovoltaic cell 10 also provides heat savings by reflecting NIR and IR light. More particularly, the transparent photovoltaic cell 10 has a strongest peak reflectance of greater than or equal to about 10%, greater than or equal to about 15%, greater than or equal to about 20%, greater than or equal to about 25%, greater than or equal to about 35%, greater than or equal to about 40%, or greater than or equal to about 50% at wavelengths of greater than or equal to about 650 nm to less than or equal to about 5000 nm. Although the light absorbing material is substantially or completely nonabsorbent to light having wavelengths of greater than or equal to about 650 nm to less than or equal to about 5000 nm, other components of the transparent photovoltaic cell 10, such as, for example, the electrodes, may absorb a portion of the light having wavelengths (in addition to reflection) of greater than or equal to about 650 nm to less than or equal to about 5000 nm that is not reflected. Another portion of the light having wavelengths of greater than or equal to about 650 nm to less than or equal to about 5000 nm that is not reflected is transmitted through the transparent photovoltaic cell 10. Accordingly, the transparent photovoltaic cell 10 can replace a low-e window or can be combined with a low-e coating or window. In another embodiment, the transparent photovoltaic cell 10 is integrated into a multijunction photovoltaic cell or device.

The transparent photovoltaic cell 10 has a power conversion efficiency (PCE) of greater than or equal to about 0.3%, greater than or equal to about 0.5%, greater than or equal to about 1%, greater than or equal to about 1.5%, greater than or equal to about 3%, greater than or equal to about 5%, greater than or equal to about 6%, or greater than or equal to about 7%.

The transparent photovoltaic cell 10 has an external quantum efficiency (EQE) at any wavelength less than about 450 nm of greater than or equal to about 20%, greater than or equal to about 30%, greater than or equal to about 40%, greater than or equal to about 50%, greater than or equal to about 60%, greater than or equal to about 70%, or greater than or equal to about 80%.

The light absorbing material of the active layer 14 is either a halide perovskite or a metal halide, a metal nitride, a metal sulfide, a metal selenide, a metal telluride, an alloy thereof, or a combination thereof. The light absorbing material is provided as a thin layer, nanoparticles, or nanocrystals.

In various embodiments, the light absorbing material of the active layer 14 is a halide perovskite. A perovskite is a material that has the same type of crystal structure as calcium titanium oxide ($CaTiO_3$; i.e., naturally occurring perovskite). The crystal structure is known as the "perovskite structure" or $^{XII}A^{2+VI}B^{4+}X^{2-}_3$ with oxygen in the face centers. The general formula for a perovskite compound is $ABX_3$, where the A and B cations are cations of different sizes (the A cation typically being a $1^+$ cation that is larger than the B cation, which is typically a $2^+$ cation) and X is an anion that bonds to both A and B. The ideal cubic-symmetry structure has the B cation in 6-fold coordination, surrounded by an octahedron of anions, and the A cation in 12-fold octahedral coordination. In various embodiments, the light absorbing material includes at least one perovskite, hybrid halide perovskite, oxide perovskite, layered halide perovskite, or at least one inorganic halide perovskite. Hybrid halide perovskites have the formula $ABX_3$, where A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X is a halide or a combination of halides. By blending various A, B, and X components, the halide perovskite can be tuned to have a desired bandgap.

For example, the bandgap generally increases as the halide X is changed from I to Br to Cl to F.

In some embodiments, the halide perovskite comprises F, Cl, Br, and I and has a bandgap of greater than or equal to about 2.75 eV and less than or equal to about 3.2 eV.

In some embodiments, the halide perovskite comprises F and at least one other halide.

In some embodiments, the halide perovskite comprises Cl and at least one other halide.

In some embodiments, the halide perovskite comprises Br and at least one other halide.

In some embodiments, the halide perovskite comprises I and at least one other halide.

In various embodiments, the light absorbing material of the active layer 14 is a metal halide, a metal nitride, a metal sulfide, a metal selenide, a metal telluride, alloys thereof, and combinations thereof. The metal halide comprises at least one of $PbI_2$, $PbCl_2$, $PbBr_2$, $PbI_xBr_{(1-x)}$, $PbI_xCl_{(1-x)}$, $PbBr_xCl_{(1-x)}$, $SnI_2$, $SnCl_2$, $SnBr_2$, $SnI_xBr_{(1-x)}$, $SnI_xCl_{(1-x)}$, $SnBr_xCl_{(1-x)}$, $GeI_2$, $GeCl_2$, $GeBr_2$, $GeI_xBr_{(1-x)}$, $GeI_xCl_{(1-x)}$, $GeBr_xCl_{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI_3$, $A_2TiI_6$, $A_2TiCl_6$, and $A_2TiBr_6$, where A is an alkali metal (Li, Na, K, Rb, Cs, or a combination thereof), an organic cation (methylammonium (MA), formamidinium (FA), ethanediammonium (EA), iso-propylammonium, dimethylammonium, guanidinium, piperidinium, pyridinium, pyrrolidinium, imidazolium, t-butylammonium or a combination thereof), or a combination thereof; the metal nitride comprise at least one of $In_{(x)}Ga_{(1-x)}N$ and $In_{(x)}Al_{(1-x)}N$; the metal sulfide comprises $ZnS_{(x)}Se_{(1-x)}$; the metal selenide comprises at least one of ZnSe, $ZnO_{(x)}Se_{(1-x)}$ and $Zn_{(x)}Mg_{(1-x)}Se$; and the metal telluride comprises at least one of $Zn_{(x)}Mg_{(1-x)}Te$ and $BeSe_{(x)}Te_{(1-x)}$, wherein for all of the above formulas $0 \leq x \leq 1$. In some embodiments, the light absorbing material is at least one of $In_{(x)}Ga_{(1-x)}N$ ($0.05 \leq x \leq 0.25$), $In_{(x)}Al_{(1-x)}N$ ($0.25 \leq x \leq 0.7$), $ZnS_{(x)}Se_{(1-x)}$ ($0.1 \leq x \leq 0.9$), $Zn_{(x)}Mg_{(1-x)}SE$ ($0.05 \leq x \leq 0.5$), $Zn_{(x)}Mg_{(1-x)}Te$ ($0.05 \leq x \leq 0.95$), and $BeSe_{(x)}Te_{(1-x)}$ ($0.6 \leq x \leq 1$). By at least one of selecting suitable values for x and blending various light absorbing materials together, the light absorbing material can be tuned to have a desired bandgap, i.e., a bandgap of greater than or equal to about 2.75 eV and less than or equal to about 3.2 eV, as discussed above. For example, x can be chosen to provide a light absorbing material with a bandgap of greater than or equal to about 2.75 eV and less than or equal to about 3.2 eV, a plurality (at least two) of light absorbing materials can be combined to provide a bandgap of greater than or equal to about 2.75 eV and less than or equal to about 3.2 eV, or both.

It is understood that while the light absorbing material is either a halide perovskite or a metal halide, a metal nitride, a metal sulfide, a metal selenide, a metal telluride, alloys thereof, and combinations thereof, these materials are limited in that they must be assembled into the transparent photovoltaic cell 10 and comply with each of the requirements set forth above, including the bandgap requirements, the absorption requirements, the transmittance requirements, the CRI requirements, the PCE requirements, and the EQE requirements.

The active layer 14 has a thickness $T_{AL}$ of greater than or equal to about 5 nm to less than or equal to about 5000 nm, greater than or equal to about 10 nm to less than or equal to about 1000 nm, greater than or equal to about 50 nm to less than or equal to about 600 nm, greater than or equal to about 100 nm to less than or equal to about 500 nm, or greater than or equal to about 200 nm to less than or equal to about 400 nm.

The first electrode 12 and the second electrode 16 are independently a visibly transparent anode and a visibly transparent cathode. The first and second electrodes 12, 16 comprise a visibly transparent electrically conducting material individually selected from the group consisting of a conducting oxide, such as indium tin oxide (ITO), aluminum doped zinc oxide (AZO), fluorine doped tin oxide (FTO), indium zinc oxide, InZnAlO (IZAO, e.g., 90 wt. % $In_2O_3$, 5 wt. % ZnO, and 5 wt. % $Al_2O_3$), InAlZnSnO (IZATO), zinc oxide, ZnAlO (ZAO), cadmium oxide, zirconium indium oxide (ZrIO), and gallium zinc oxide (GZO), a metal, such as Al, Au, Ag, Mo, Cu, or Ni, carbon, graphene, graphene oxide, poly(3,4-ethylenedioxythiophene) polystyrene sulfonate (PEDOT:PSS), and combinations thereof. The visibly transparent electrically conducting material can be a thin film, an ultrathin film, nanowires (e.g., of Al, Au, Ag, Mo, Cu, and/or Ni), a nanowire mesh, nanotubes (e.g., carbon nanotubes, nanoparticles, or a combination thereof.

In some embodiments, at least one of the first electrode 12 and the second electrode 16 comprises a first layer comprising the visibly transparent electrically conducting material and a second layer comprising a transparent electrically conducting organic material. In FIG. 1, the second electrode 16 comprises an optional second electrode layer 18 comprising a transparent electrically conducting organic material. The transparent electrically conducting organic material bridges the visibly transparent electrically conducting material, such as an electron transport layer, and acts to reduce reflections. By reducing reflections, the transparent photovoltaic cell 10 becomes more transparent. Non-limiting examples of suitable transparent electrically conducting organic materials include aluminum tris(8-hydroxyquinolinate) ($Alq_3$), 4,4'-Bis(N-carbazolyl)-1,1'-biphenyl (CBP), N,N'-Di(1-naphthyl)-N,N'-diphenyl-(1,1'-biphenyl)-4,4'-diamine (NPD), 2,2',7,7'-Tetrakis[N,N-di(4-methoxyphenyl)amino]-9,9'-spirobifluorene, N,N'-Bis(3-methylphenyl)-N,N'-bis(phenyl)-benzidine (TPD), derivatives thereof, and combinations thereof. In some embodiments, the second electrode layer 18 comprises a non-organic compound, such as $MoO_3$, $WO_3$, or a combination thereof. The optional second electrode layer 18 has a thickness $T_{OM}$ of greater than or equal to about 5 nm to less than or equal to about 200 nm.

The first electrode 12 has a thickness $T_{E1}$ and the second electrode 16 has a thickness $T_{E2}$, wherein thickness $T_{E1}$ and thickness $T_{E2}$ are individually and independently greater than or equal to about 1 nm to less than or equal to about 200 nm, greater than or equal to about 50 nm to less than or equal to about 150 nm, or greater than or equal to about 75 nm to less than or equal to about 125 nm.

Figure 2:
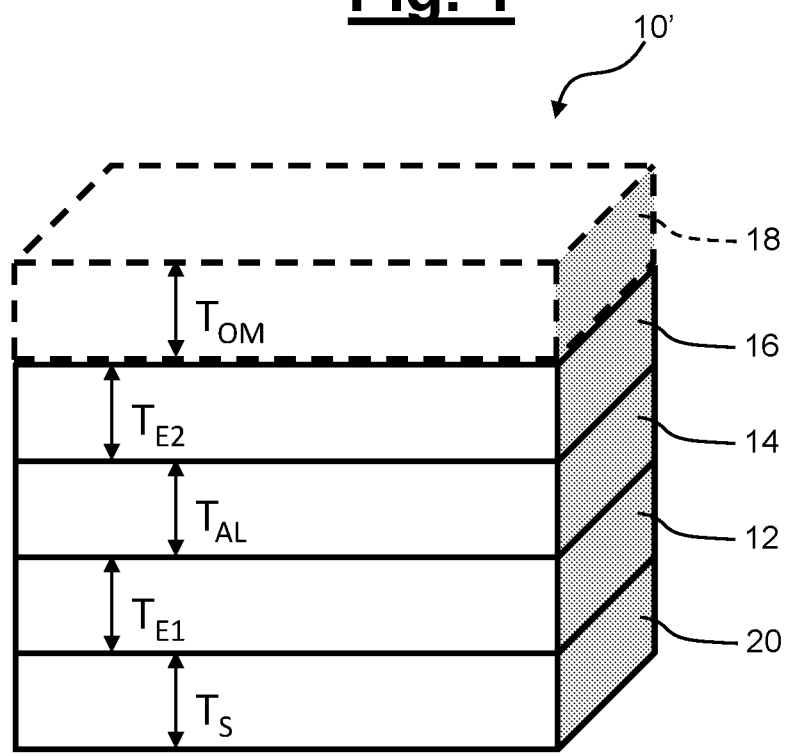
FIG. 2 is an illustration of a second device according to various aspects of the current technology.

In some embodiments, one of the first electrode 12 or the second electrode 16 is disposed on a substrate. For example, FIG. 2 shows a second transparent photovoltaic cell 10', which has the same first electrode 12, active layer 14, second electrode 16, and optional second electrode layer 18 as the transparent photovoltaic cell 10 of FIG. 1. However, the first electrode 12 of the second transparent photovoltaic cell 10' is disposed on a substrate 20. The substrate 20 is visibly transparent and comprises glass, low iron glass, plastic, poly(methyl methacrylate) (PMMA), poly-(ethylmethacrylate) (FEMA), (poly)-butyl methacrylate-co-methyl methacrylate (PBMMA), polyethylene terephthalate (PET), polycarbonate, or polyimides, such as Kapton® polyimide films (DuPont, Wilmington, DE). The substrate 20 has a thickness $T_S$ of greater than or equal to about 1 μm to less than or equal to about 300 mm.

Figure 3:
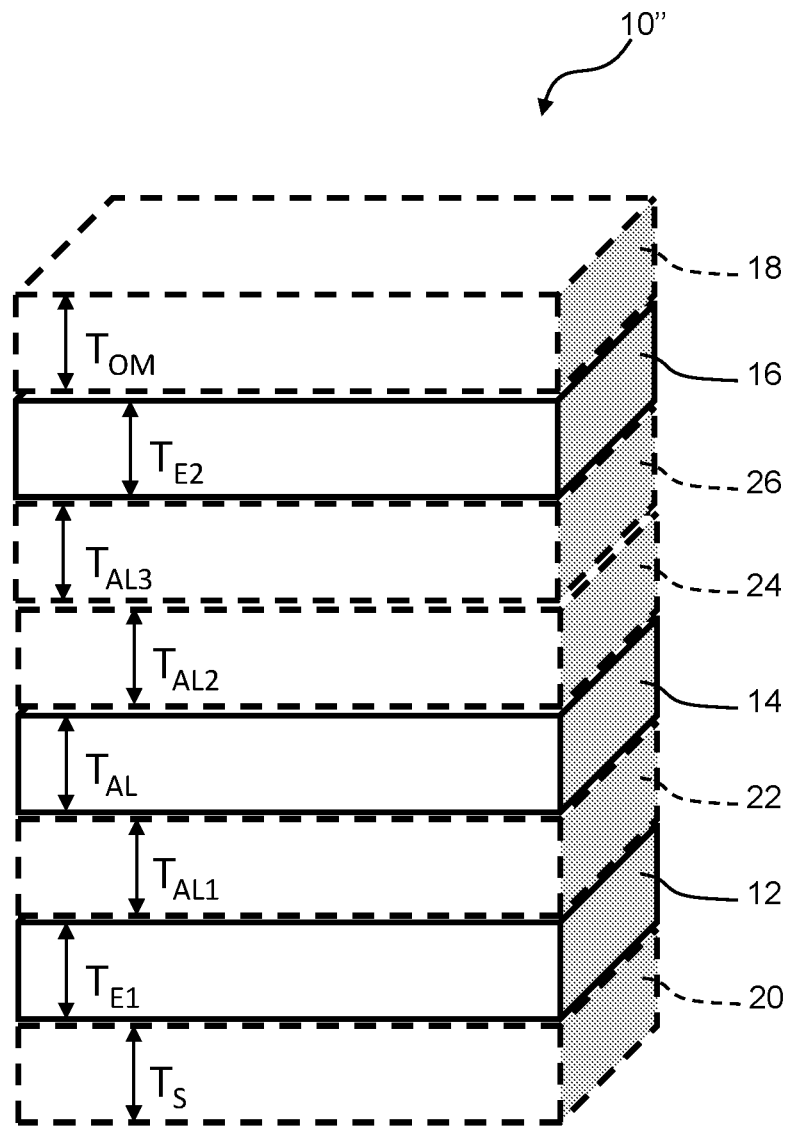
FIG. 3 is an illustration of a third device according to various aspects of the current technology.

FIG. 3 shows a third transparent photovoltaic cell 10", which has the same first electrode 12, active layer 14, second electrode 16, and optional second electrode layer 18 as the transparent photovoltaic cell 10 of FIG. 1. The third transparent photovoltaic cell 10" optionally includes a substrate 20 as described with reference to FIG. 2. However, the third transparent photovoltaic cell 10" comprises at least one optional adjunct layer. For example, in FIG. 3, the third transparent photovoltaic cell 10" is shown with an optional first adjunct layer 22 disposed between the first electrode 12 and the active layer 14, an optional second adjunct layer 24 located between the active layer 14 and the second electrode 16, and an optional third adjunct layer 26 located between the optional second adjust layer 24 and the second electrode 16. The adjunct layers 22, 24, 26 can individually be a hole transport layer, an electron blocking layer, a buffer layer, an electron transport layer, a hole blocking layer, or an electron extraction layer.

In various embodiments, the third transparent photovoltaic cell 10" comprises the optional first adjunct layer 22 as a hole transport layer/work function modifying layer/buffer layer/hole selective layer, wherein work function modifying layers are added to get a wetting. Here, the optional first adjunct layer 22 comprises poly(3,4-ethylenedioxythiophene) polystyrene sulfonate (PEDOT:PSS), poly(3-hexylthiophene-2,5-diyl) (P3HT), N,N'-Bis(naphthalen-1-yl)-N,N'-bis(phenyl)-2,2'-dimethylbenzidine (NPD), N,N'-Bis(3-methylphenyl)-N,N'-bis(phenyl)-benzidine (TPD), 2,2',7,7'-Tetrakis(N,N-diphenylamino)-2,7-diamino-9,9-spirobifluorene (spiro-TAD), Poly[N,N'-bis(4-butylphenyl)-N,N'-bis(phenyl)-benzidine](poly-TPD), CuSCN, CuI, $MoO_3$, NiO, or a combination thereof.

In various embodiments, the third transparent photovoltaic cell 10" comprises the optional second adjunct layer 24 as an electron transport layer/electron extraction layer. Here, the optional second adjunct layer 24 comprises a fullerene, such as $C_{60}$, $C_{70}$, $C_{84}$, or phenyl-$C_{61}$-butyric-acid-methylester (PCBM), ZnO, $TiO_2$, NiO, $MoO_3$, nanotubes, conductive nanoparticles (e.g., ITO), or a combination thereof. For example, the role of fullerenes in perovskite solar cells is typically to aid in electron extraction, and therefore, layers should be as thin as possible to prevent tail state absorption: less than or equal to about 40 nm, less than or equal to about 20 nm, less than or equal to about 10 nm, less than or equal to about 5 nm, or less than or equal to about 1 nm.

In various embodiments, the third transparent photovoltaic cell 10" comprises the optional third adjunct layer 26 as an electron transport layer/electron extraction layer/buffer layer/hole blocking layer. The optional third adjunct layer 26 provides an ohmic contact between the active layer 14 and the second electrode 16. Here, the optional third adjunct layer 26 comprises [6,6]-phenyl-C61-butyric acid methyl ester (PCBM), Al-doped ZnO (AZO), $TiO_2$, bathocuproine (BCP), $MoO_3$, or a combination thereof.

The optional first adjunct layer 22 has a thickness $T_{AL1}$, the optional second adjunct layer 24 has a thickness $T_{AL2}$, and the optional third adjunct layer 26 has a thickness $T_{AL3}$. $T_{AL1}$, $T_{AL2}$, and $T_{AL3}$ are independently and individually greater than or equal to about 0.05 nm to less than or equal to about 100 nm. When the optional second adjunct layer 24 comprises a fullerene, the thickness $T_{AL2}$ is less than or equal to about 50 nm.

When the third transparent photovoltaic cell 10" comprises an adjunct layer 22, 24, 26 that is an electron transport layer or a hole transport layer, the electrode 12, 16 that is located adjacent to the electron transport layer is the cathode and the electrode 12, 16 that is adjacent to the hole transport layer is the anode.

Figure 4:
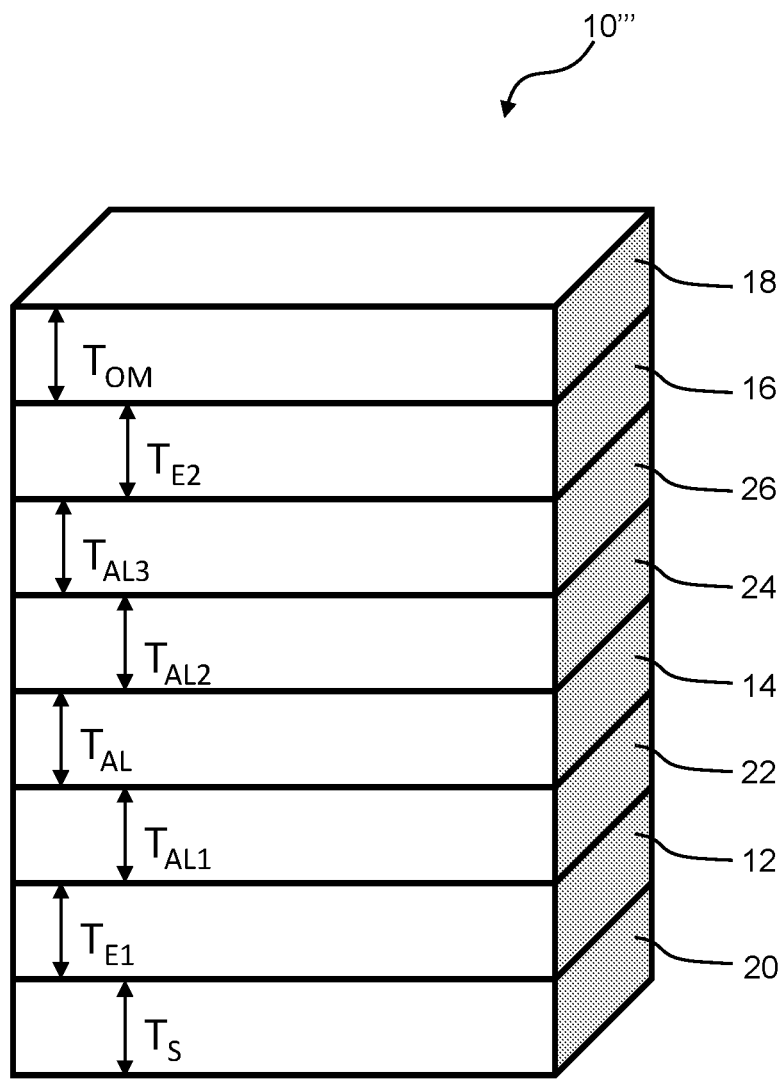
FIG. 4 is an illustration of a fourth device according to various aspects of the current technology.

FIG. 4 shows a fourth transparent photovoltaic cell 10'''. The fourth transparent photovoltaic cell 10''' comprises every layer described in relation to FIGS. 1-3. In particular, the fourth transparent photovoltaic cell 10''' sequentially comprises the substrate 20, the first electrode 12, the first adjunct layer 22, the active layer 14, the second adjunct layer 24, the third adjunct layer 26, the second electrode 16, and the second electrode layer 18. Here, the first adjunct layer 22 is a hole transport layer and the second adjunct layer 24 is an electron transport layer. Therefore, the first electrode 12 is an anode and the second electrode 16 is a cathode. It is understood that each of the layers 12, 14, 16, 18, 20, 22, 24, 26 is visibly transparent. It is also understood that any of the transparent photovoltaic cells 10, 10', 10", 10''' described herein can further comprise additional active layers and additional adjunct layers.

Any of the transparent photovoltaic cells described herein can be used as a rigid display screen, a flexible display screen, a watch crystal, an automotive glass, or an architectural glass, as non-limiting examples.

The current technology also provides a method of fabricating a transparent photovoltaic cell. The method comprises tuning a light absorbing material to have an acceptable bandgap as described above. When the light absorbing material is a halide perovskite, tuning is performed by blending various A, B, and X components. When the light absorbing material is a metal halide, a metal nitride, a metal sulfide, a metal selenide, a metal telluride, an alloy thereof, or a combination thereof, tuning is performed by alloying or blending various metal halides, metal nitrides, metal sulfides, metal selenides, metal tellurides, or alloys thereof together to provide a bandgap greater than or equal to about 2.75 eV and less than or equal to about 3.2 eV.

The method comprises sequentially disposing the following layers onto a visibly transparent substrate: a layer comprising a first electrode, a layer comprising a light absorbing material, and a layer comprising a second electrode. In various embodiments, the method also includes disposing adjunct layers throughout the transparent photovoltaic cell.

The disposing of the various layers can be performed by any means known in the art. Non-limiting examples of means for disposing the various layers include spin coating, dip coating, doctor blading, chemical vapor deposition (CVD), drop casting, spray coating, plasma-sputtering, vacuum depositing, and combinations thereof. Moreover, the layer comprising a perovskite material may be deposited additive-free in a one-step synthesis or additive-free in a two or more step synthesis. In a one-step synthesis, all perovskite reactants (e.g., $PbI_2$ and MAI) are deposited from one solution. A two or more-step synthesis involves the deposition of one of the reactants followed by reaction with a second reactant, either as a second deposited layer or as a gas phase diffusion process, for example.

As described above in regard to the devices, the adjunct layers, which can be, for example, hole transport layers or electron transport layers, may include a single layer or a plurality of layers. The layer or layers are deposited individually and sequentially.

When all the layers have been deposited, the method comprises annealing the device at a temperature of from about 75° C. to about 150° C., such as a temperature of about 90° C., from about 2 minutes to about 60 minutes or longer. In some embodiments, annealing is conducted for about 10 minutes.

Embodiments of the present technology are further illustrated through the following non-liming examples.

Example 1

Halide perovskite tunability is used as a platform for creating UV harvesting TPVs with near ideal bandgaps and visible absorption cutoffs that enable high AVT and CRI. TPV devices from various halide perovskite compositions are demonstrated with a PCE of up to 0.52% simultaneously with an AVT of 70% and a CRI over 92. Given that these cells are limited by quantum efficiencies of 20-30%, efficiencies above 3% are achievable because halide perovskites cells now readily achieve quantum efficiencies above 90%. New halide perovskite compositions for application in highly transparent photovoltaics and TPV multi-junctions are demonstrated.

Methods

Materials and Precursor Preparation: Dimethylformamide (DMF, 99.8%, Aldrich.), dimethyl sulfoxide (DMSO, 99.9%, Aldrich.), PEDOT:PSS (Clevios PVP Al 4083, Heraeus; diluted to 10% by water for use), $CH_3NH_3Cl$ (MACl, 98%, Aldrich.), $PbBr_2$ (99%, Aldrich.), $PbCl_2$ (98%, Aldrich.), $C_{60}$ (99.9%, MER.), 2,9-dimethyl-4,7-diphenyl-1,10-phenanthroline (BCP, 99%, Lumtech.) and Tris-(8-hydroxy-quinolinato)aluminium ($Alq_3$, 99.5%, Lumtech.) are used as received. To prepare the mixed halide perovskite precursor solution, MACl:$PbBr_2$:$PbCl_2$ (135 mg, 220 mg and 389 mg, respectively) is added in a mixed solvent of DMF and DMSO (1.5 ml and 0.5 ml, respectively). For pure chloride perovskite precursor solution, MACl:$PbCl_2$ (67.5 mg and 278 mg, respectively) is added in a mixed solvent of DMF and DMSO (1.5 ml and 0.5 ml, respectively). The solutions are then stirred for 30 minutes and filtered with 0.45 μm PTFE filters before use.

Device Fabrication: The PEDOT solution is spin-coated onto pre-cleaned ITO substrates at 6000 rpm for 10 seconds and then annealed at 100° C. for 5 minutes. The perovskite precursor is spin-coated on top of the PEDOT film at 5000 rpm for 12 seconds, and then moved into a homemade vacuum chamber, evacuated to approximately 10 mTorr, and left in the chamber for 1 minute. The samples are then treated by methylamine gas for 2 seconds. The substrate is then moved into the evaporation chamber for deposition of $C_{60}$ (20 nm) as an electron extraction layer and BCP (7.5 nm) for ohmic contact. Finally, 5 nm thick of silver layer and 60 nm of $Alq_3$ are deposited as the transparent electrode by thermal evaporation through a shadow mask with a final measured device area of 4.85 $mm^2$.

Measurement and Characterization: UV-VIS-NIR transmission and reflection spectra are collected using PerkinElmer Lambda 800 spectrometer. XRD data is measured using CuKα (0.154 nm) emission with a Bruker D2 phaser. A field-emission scanning electron microscopy (Carl Zeiss Auriga Dual Column FIB SEM) is used to acquire SEM images. The current density-voltage characteristics (J-V curves) are obtained using a Keithley 2420 sourcemeter under both dark and AM1.5 G solar simulation, where the light intensity is measured using a NREL-calibrated Si reference cell with KG5 filter (xenon arc lamp with the spectral-mismatch factor of 1.20). Devices are scanned at a rate of 50 mV $s^{-1}$. The spectral mismatch for UV-only TPVs is considerably more sensitive to lamp spectra measurements due to a large difference in a quantum efficiency of the tested cell versus a calibrated Si reference cell. EQE measurements are performed using a QTH lamp with a monochromator, chopper, lock-in amplifier, and calibrated Si detector to measure the intensity. The J-V and EQE are measured on un-encapsulated devices/samples in ambient air. The IQE is evaluated by measuring the device absorption via reflectivity measurements of the overall device (A=1-R-T).

Results

Figure 5A:
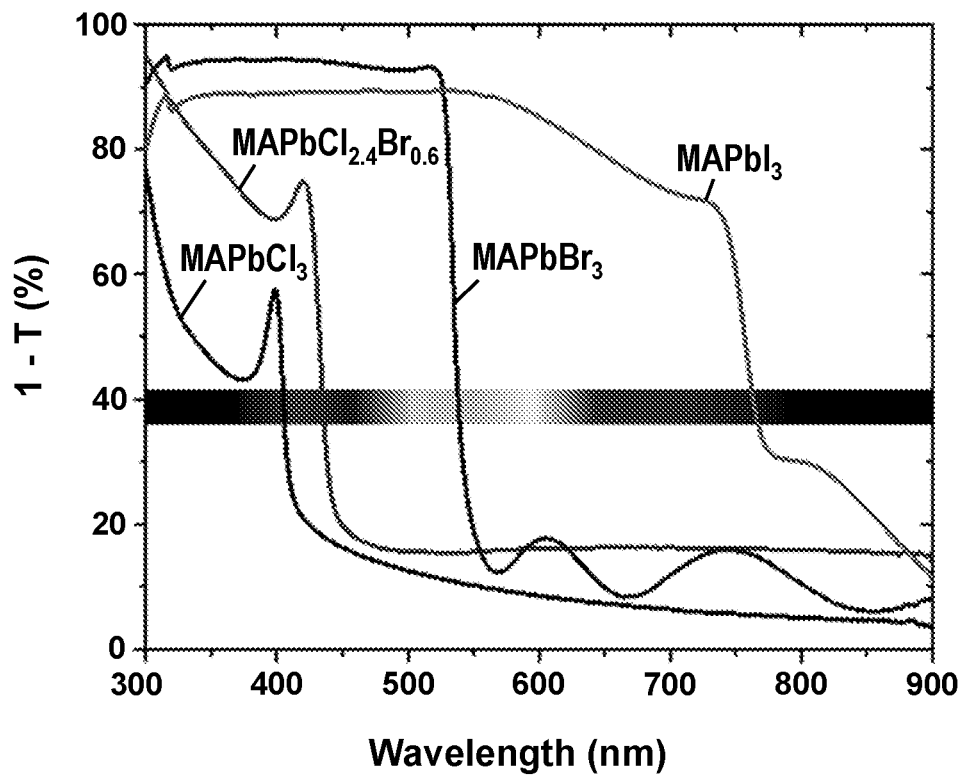
FIG. 5A shows absorption (1-Transmission) spectra of halide perovskite films of varying composition.

Methylammonium (MA) lead halide is a perovskite semiconductor. While other compositions are being actively investigated, little work has been done to optimize devices with bandgaps near the visible absorption edge. FIG. 5A shows absorption spectra of MA-based perovskite films with various halide substitutions (Cl, Br, I). Among these perovskites, the iodide ($MAPbI_3$) and bromide ($MAPbBr_3$) perovskites have strong visible absorption, and thus, have been used in traditional opaque solar cells as a light absorber. Although there have been increasing efforts to prepare semitransparent solar cells, the device AVT and CRI is generally low due to the direct tradeoff in efficiency and transparency. To date, the highest reported AVT for perovskite-based TPVs is only 46% (for reference the highest AVT organic TPV is 66%). By comparison, $MAPbCl_3$ has an absorption cutoff at 410 nm, thereby enabling AVTs over 90%. Previous theoretical work has shown that the ideal UV-only TPV bandgap is 430-440 nm. To enhance the light absorption range while avoiding influence on the visible light transmission, devices with doped compositions of $MAPbCl_{3-x}Br_x$ are developed to sensitively position absorption cutoffs between 410-440 nm. Bromide substitution of x=20% results in the absorption of mixed halide perovskite film that extends ideally to 435 nm. Accordingly, UV harvesting TPVs are developed with $MAPbCl_3$ and $MAPbCl_{2.4}Br_{0.6}$ perovskite absorbers with the inverted device structure as shown in FIG. 5B.

Figure 6A:
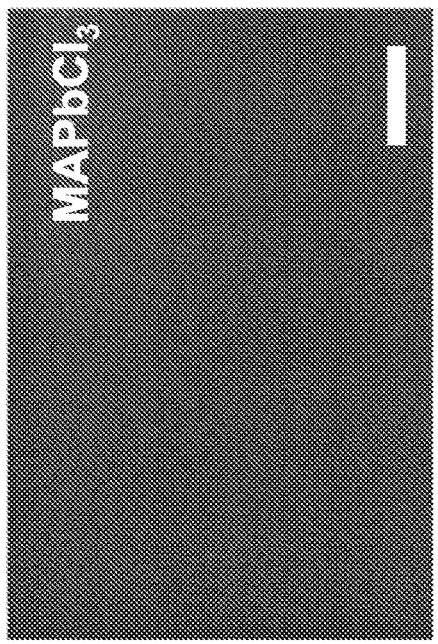
FIG. 6A shows a surface morphology of UV harvesting perovskite films for $MAPbCl_3$. The scale bar is 1 μm.
Figure 6B:
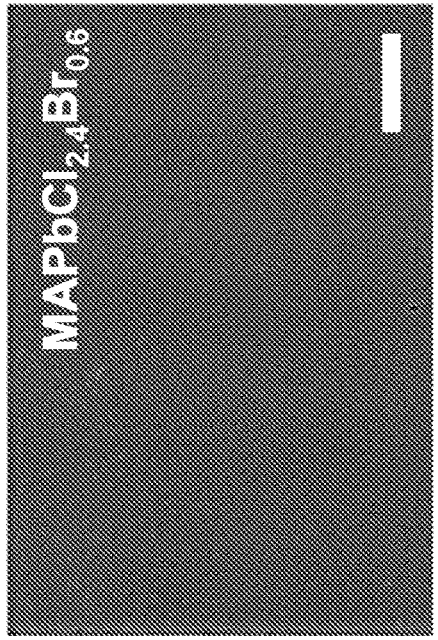
FIG. 6B shows a surface morphology of UV harvesting perovskite films for $MAPbCl_{2.4}Br_{0.6}$. The scale bar is 1 μm.
Figure 6C:
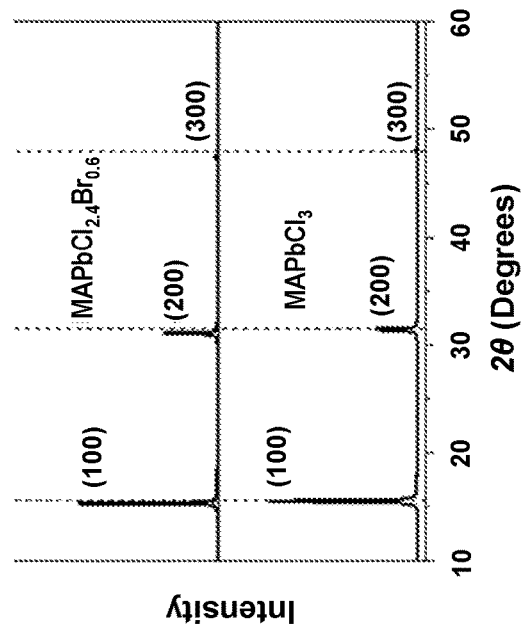
FIG. 6C is a graph showing XRD patterns of UV harvesting perovskite films.

UV-harvesting perovskite films are prepared by solution deposition via spin-coating. Due to the limited solubility of many Cl precursors in typical solvents, greater attention to the processing is required to form smooth perovskite layers with minimal haze and roughness to prevent shorting. A vacuum-assisted solution deposition process is combined with methylamine gas post-treatment to obtain high quality films that are highly transparent with minimal light scattering. Scanning electron microscopy (SEM) images of $MAPbCl_3$ and $MAPbCl_{2.4}Br_{0.6}$ films provided in FIGS. 6A-B and 7A-7B show that both the pure chloride and bromide-doped perovskite films are smooth and uniform. Although the films do not exhibit grains as large as iodide perovskite films, strong diffraction peaks observed in x-ray diffraction (XRD) patterns indicate good crystallization of perovskite film with a single preferred orientation. In FIG. 6C, diffraction peaks at 15.6°, 31.5° and 48.0° correspond to the $MAPbCl_3$ cubic phase indexed as the (100), (200) and (300), respectively. With 20% bromide doping, the diffraction peaks are shifted to slightly lower diffraction angles (15.4°, 31.1° and 47.4°), which still are consistent with a cubic phase and also consistent with other literature reports. This shift indicates a larger lattice constant (a=5.737±0.008 Å) resulting from the larger Br atoms, compared to the pure $MAPbCl_3$ (a=5.677±0.002 Å).

Figure 6D:
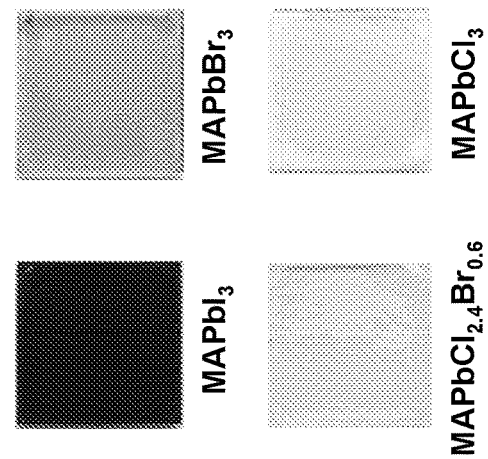
FIG. 6D shows photographs of halide perovskite films. $MAPbI_3$ is black, $MAPbBr_3$ is deep orange, $MAPbCl_{2.4}Br_{0.6}$ is faint yellow, and $MAPbCl_3$ has no observable color.

Photographs of various halide perovskite films are shown in FIG. 6D. The mixed halide perovskite film of $MAPbCl_{2.4}Br_{0.6}$ shows a light yellow color due to the absorption cutoff at the edge of visible light (the visible range is determined as 435-670 nm for optimal theoretical TPVs with a corresponding visible transmission greater than 99.5% when the CRI is greater than 95), whereas the MAPbCl$_3$, MAPbBr$_3$, MAPbI$_3$ appear clear, orange, and dark brown, respectively.

Figure 5B:
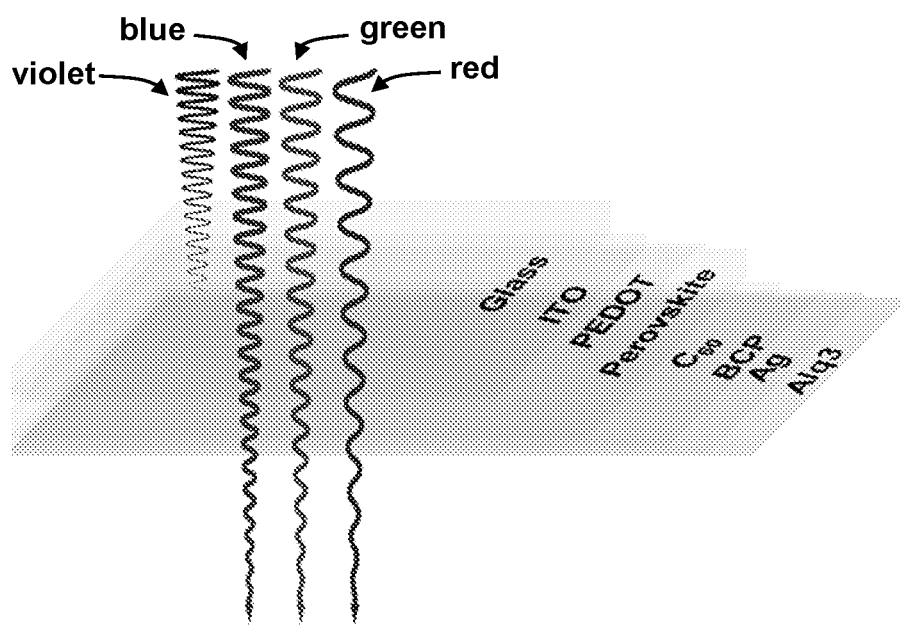
FIG. 5B shows the architecture of the perovskite UV harvesting transparent photovoltaic device.
Figure 8A:
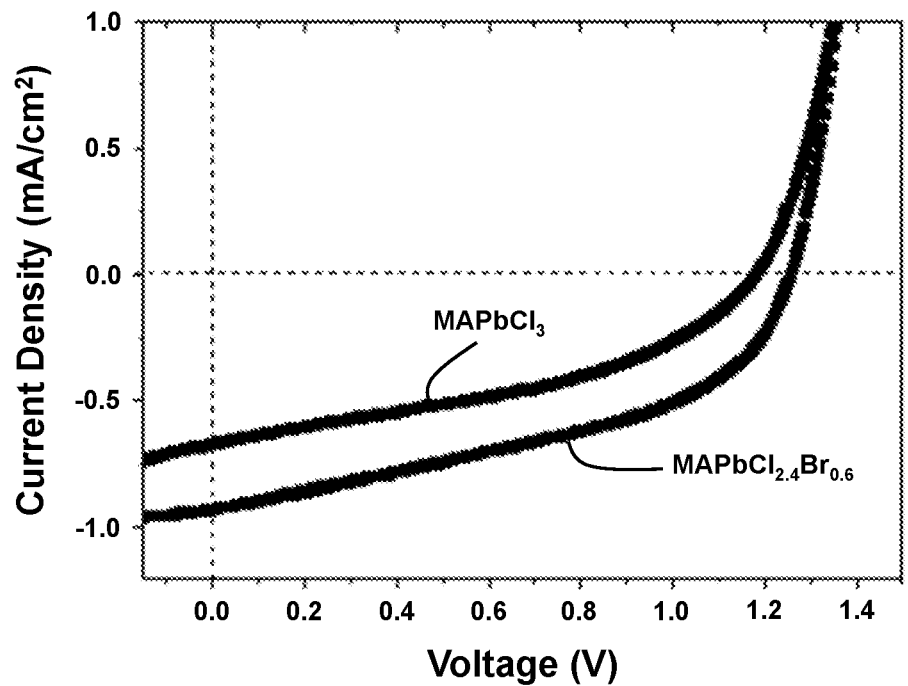
FIG. 8A shows current-voltage (J-V) curves of UV harvesting transparent perovskite photovoltaic devices measured under 1-sun illumination.
Figure 8B:
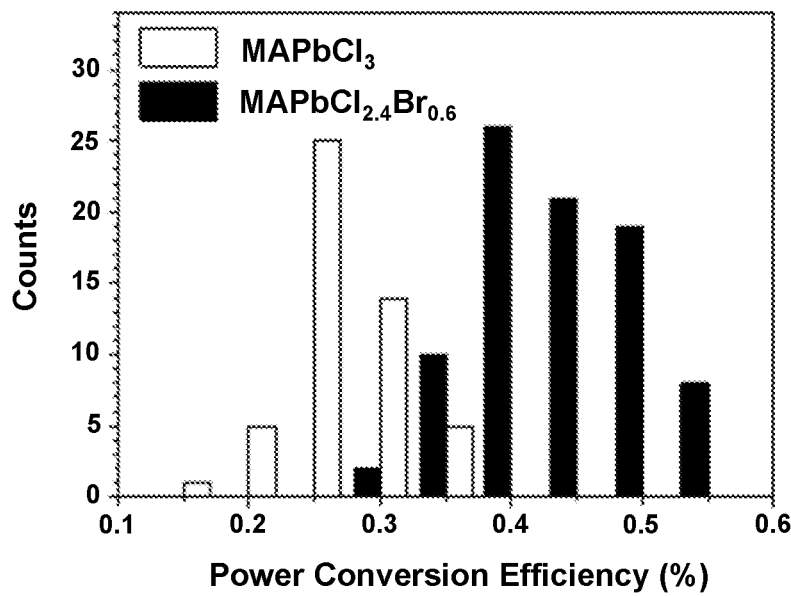
FIG. 8B shows histograms of PCE measured for 50 separate $MAPbCl_3$ devices (white) and 86 separate $MAPbCl_{2.4}Br_{0.6}$ devices (black).

UV harvesting TPVs are prepared with the architecture shown in FIG. 5B. A thin (approximately 5 nm) PEDOT layer is spin-coated on an ITO substrate to act as a hole extraction layer. After the perovskite film is grown on the PEDOT layer, a C$_{60}$ layer (20 nm) is deposited as an electron extraction layer. Bathocuproine (BCP) is then deposited on the fullerene followed by a top transparent electrode composed of Ag (5 nm)/Alq$_3$ (60 nm). Current-voltage (J-V) curves of TPV devices are shown in FIG. 8A and FIG. 8B show a histogram of device PCEs. The champion pure chloride perovskite TPV device results in a PCE of 0.33%, with a J$_{SC}$ of 0.67 mA cm$^{-2}$, a V$_{OC}$ of 1.18 V and a fill factor (FF) of 41.1%. In contrast, the best mixed halide perovskite TPV exhibits a PCE of 0.52%, with a J$_{SC}$ of 0.92 mA cm$^{-2}$, a V$_{OC}$ of 1.26 V and an FF of 44.9%. Due to the broader absorption range of MAPbCl$_{2.4}$Br$_{0.6}$ relative to MAPbCl$_3$, it is expected that the J$_{SC}$ of MAPbCl$_{2.4}$Br$_{0.6}$ device will be higher than the MAPbCl$_3$ device. Notably, the V$_{OC}$ and FF of the MAPbCl$_3$ device is also lower than MAPbCl$_{2.4}$Br$_{0.6}$ device. It can be inferred that the greater difficulty in processing pin-hole free MAPbCl$_3$ films increases the charge recombination and results in the low photovoltaic parameters of MAPbCl$_3$ device as shown in FIGS. 6A-6B. 50 separate MAPbCl$_3$ devices and 86 separate MAPbCl$_{2.4}$Br$_{0.6}$ devices result in an average PCE of 0.24±0.04% and 0.42±0.06%, respectively (Table 1). The low deviations of PCE values indicate the high reproducibility of these TPV devices.

Discussion

Figure 9A:
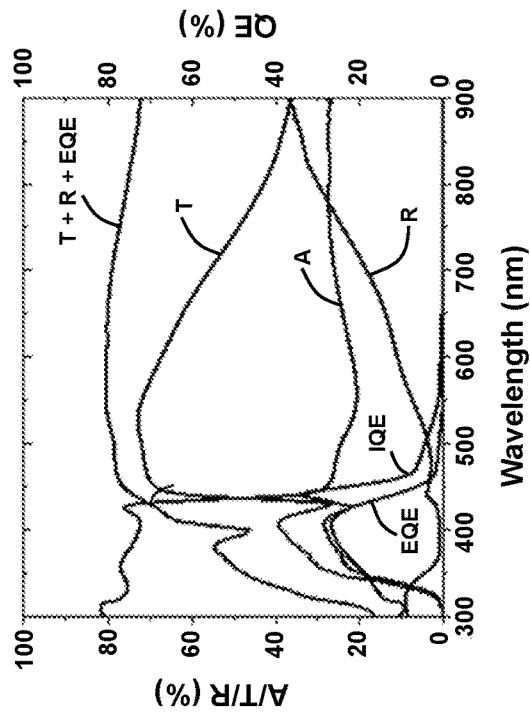
FIG. 9A shows absorption (A), transmission (T), reflection (R), external quantum efficiency (EQE), and internal quantum efficiency (IQE) for a $MAPbCl_3$ UV harvesting transparent perovskite photovoltaic device.
Figure 9B:
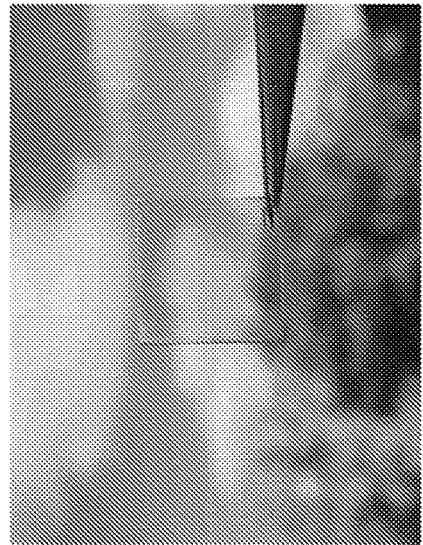
FIG. 9B shows absorption (A), transmission (T), reflection (R), external quantum efficiency (EQE), and internal quantum efficiency (IQE) for a $MAPbCl_{2.4}Br_{0.6}$ UV harvesting transparent perovskite photovoltaic device.
Figure 9C:
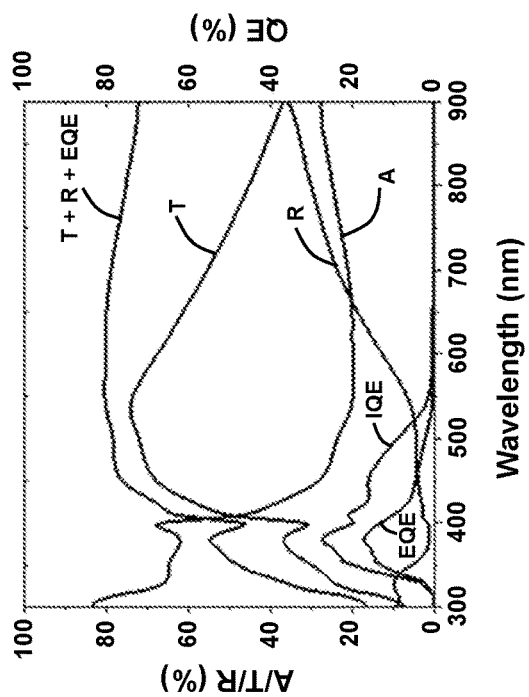
FIG. 9C is a photograph of a $MAPbCl_3$ UV harvesting transparent perovskite device.
Figure 9D:
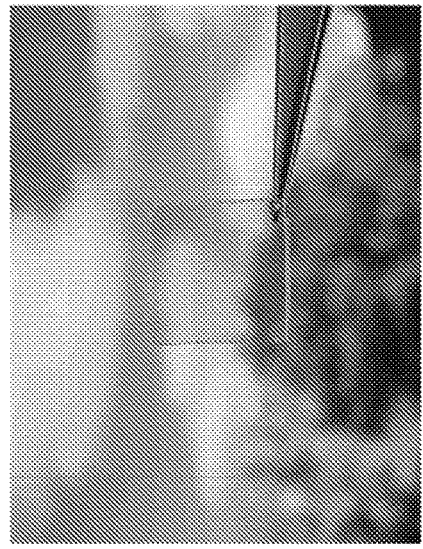
FIG. 9D is a photograph of a $MAPbCl_{2.4}Br_{0.6}$ UV harvesting transparent perovskite device.

Subsequently, the optical properties of UV harvesting TPV devices are systematically investigated. Provided in FIGS. 9A and 9B are absorption (A), reflection (R), transmission (T), external quantum efficiency (EQE), and internal quantum efficiency (IQE) spectra for each device. To satisfy the photon balance consistency check, it is shown that EQE+R+T<100% everywhere in the spectrum. As with the MAPbCl$_3$ and MAPbCl$_{2.4}$Br$_{0.6}$ perovskite films, the corresponding TPV devices exhibit sharp absorption cutoffs in the UV, while efficiently transmitting visible light. Both UV harvesting TPV devices exhibit exceptionally high AVTs of 70.7% and 69.7% for MAPbCl$_3$ and MAPbCl$_{2.4}$Br$_{0.6}$, respectively (Table 1). Shown in FIGS. 9C and 9D are photographs of complete perovskite TPV devices. While the individual films show a very slight yellow color, the addition of the top transparent cathode creates optical interference that results in a more neutral color rendering. This can be seen in the reduction of the transmission curve and increase in the reflection curve past 650 nm. Nonetheless, because there is very little absorption of the active layer in any part of the visible spectrum, both devices show exceptionally high CRI of 92.4 and 93.1 for MAPbCl$_3$ and MAPbCl$_{2.4}$Br$_{0.6}$, respectively (Table 1), referenced against the AM1.5 G solar spectrum. CRI is another important factor for describing transparent devices. CRI quantitatively describes the color quality for reproducing the incident light source through a transparent medium and is also utilized in the lighting industry. The high CRI value indicates the device has a high aesthetic quality and will have little impact on the color perception when placed over windows or displays.

TABLE 1

Figure 10:
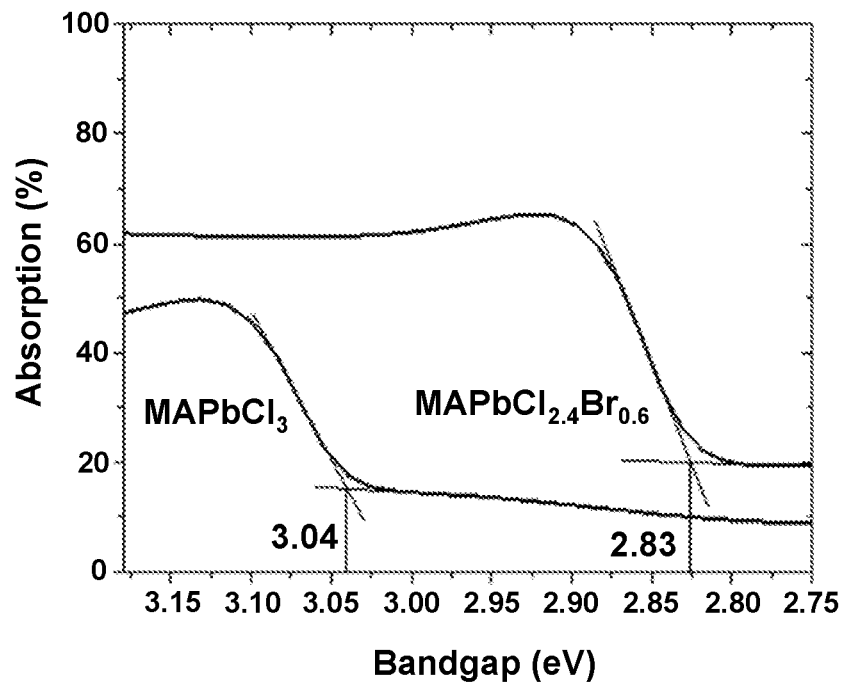
FIG. 10 is a plot for bandgap measurement from optical absorption of halide perovskite films.

Summary of device parameters for UV-only harvesting TPV devices. The bandgap was measured from optical absorption of halide perovskite films as shown in FIG. 10.

| Device | V$_{OC}$ (V) | J$_{SC}$ (mA cm$^{-2}$) | FF (%) | PCE (%) | Bandgap (eV) | AVT (%) | CRI |
|---|---|---|---|---|---|---|---|
| MAPbCl$_3$ (best) | 1.11 ± 0.11 (1.18) | 0.61 ± 0.9 (0.67) | 35.8 ± 3.7 (41.1) | 0.24 ± 0.04 (0.33) | 3.04 | 70.7 | 92.4 |
| MAPbCl$_{2.4}$Br$_{0.6}$ (best) | 1.13 ± 0.09 (1.26) | 0.85 ± 0.9 (0.92) | 43.5 ± 3.1 (44.9) | 0.42 ± 0.06 (0.52) | 2.83 | 69.7 | 93.1 |

Figure 7A:
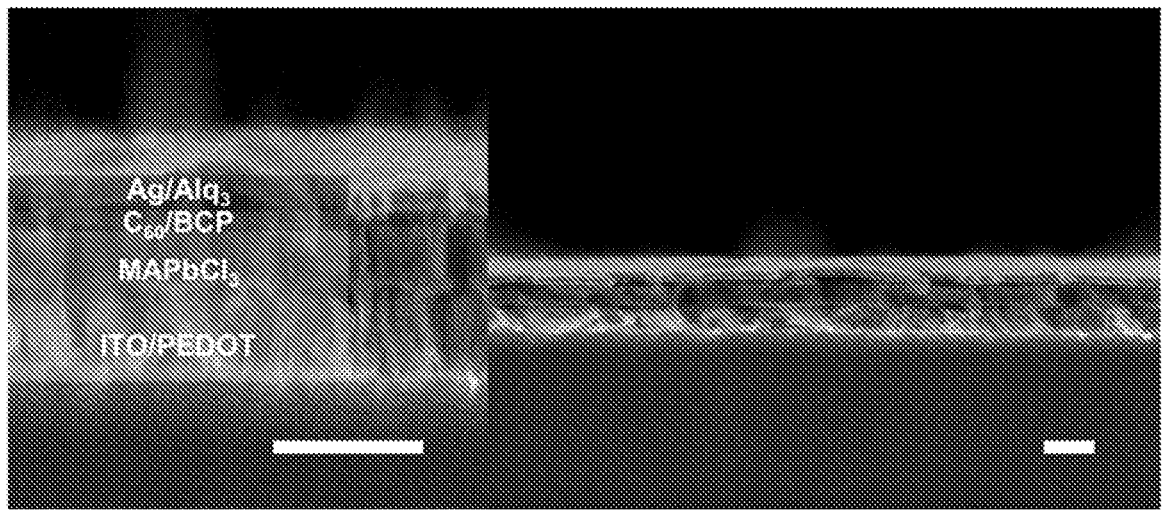
FIG. 7A shows a cross-section scanning electron microscopy (SEM) image for a $MAPbCl_3$ transparent photovoltaic (TPV) device. The scale bar is 200 nm.
Figure 7B:
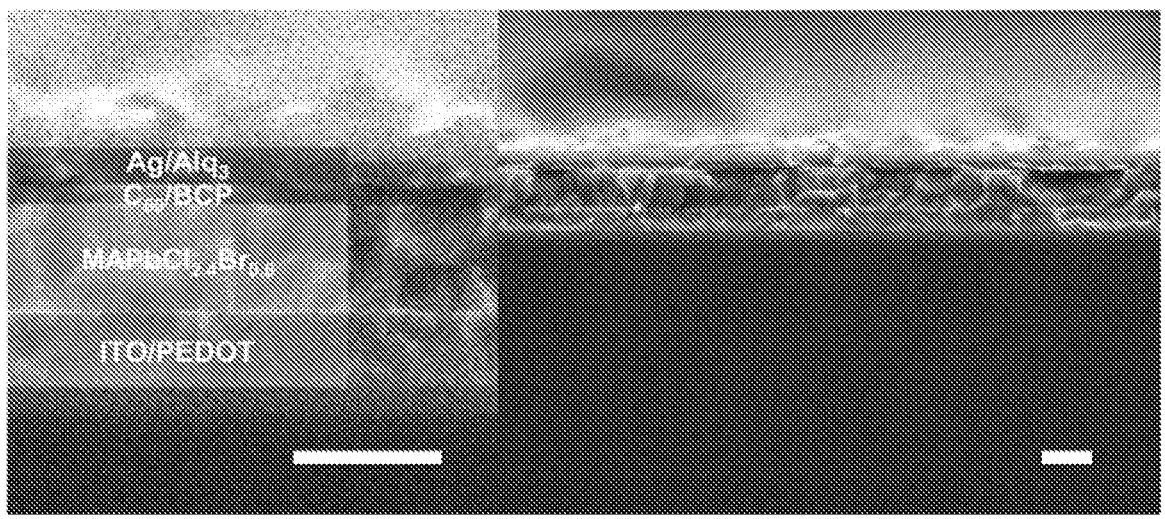
FIG. 7B shows a cross-section SEM image for a $MAPbCl_{2.4}Br_{0.6}$ TPV device. The scale bar is 200 nm.

Despite demonstrating UV harvesting TPV devices from halide perovskite semiconductors with nearly ideal optical properties (absorption cutoffs, color rendering, and transparencies) these devices may still be limited by modest quantum efficiencies. Without being bound by theory, this likely stems from the poor solubility of chloride perovskite materials (limited to 30 wt. % in DMF and DMSO), which leads to thin perovskite films (100-150 nm) that can only harvest up to 60-70% of the UV light as shown in FIGS. 7A and 7B. This further indicates that the internal quantum efficiencies (IQE) are lower than 40%, which likely could be enhanced by increasing the film quality or crystalline grain size (despite having a strongly preferred crystalline alignment). Moreover, in FIGS. 9A and 9B, it can be seen that the device reflection is greater than 10% in the range of 600-700 nm wavelengths, which reduces the transparency unnecessarily. Overall, with enhancement in the processing, the quantum efficiency could increase from 20% to 90%, FF from 45% to 70%, and V$_{OC}$ from 1.26 V to 2.00 V. Over 5% efficiency is achieved with this hybrid perovskite composition, which approaches the theoretical efficiency limits of 7% with the transparency nearing that of glass alone, as shown in Table 2.

TABLE 2

Theoretical efficiency limits of UV-only harvesting TPV devices.

| Absorption Cutoff (nm) | V$_{OC}$ (V) | J$_{SC}$ (mA cm$^{-2}$) | PCE (%) |
|---|---|---|---|
| 400 | 2.69 | 1.44 | 3.66 |
| 430 | 2.49 | 2.56 | 6.43 |
| 440 | 2.43 | 3.13 | 7.18 |

UV harvesting TPV devices have been demonstrated based on the platform of halide perovskite light absorbers. This indicates that the TPV devices selectively harvest UV light with ideal absorption cutoffs to minimize visual impact, while providing a pathway to maximizing performance. Based on mixed composition halide perovskites, TPV devices are shown with ideally tuned bandgap that exhibit up to 0.52% PCE with AVT of 70% and a CRI over 92. The high AVT of 70.7% makes these UV-harvesting TPV devices one of the highest performing highest-AVT photovoltaic cells reported to date. The foregoing reveals that the exceptional potential of perovskite materials effectively translates to TPV devices. These types of technologies are an important compliment to other near-infrared harvesting TPVs in rapidly reaching both single-junction and multi-junction efficiency limits.

Example 2

TPV devices have a number of unique advantages compared with opaque photovoltaic devices. However, balancing efficiency and transparency has been difficult. Few TPV devices with PCE over 1% have been demonstrated when the AVT is over 70%. Here, a series of metal halide based TPVs with both increased efficiency and transparency are reported. The effect of metal halide layer thicknesses and compositions is systematically studied and subsequently, metal halide TPVs are evaluated with regard to efficiency, transparency, and stability. The results show that metal halide TPVs with UV wavelength selective absorption can achieve efficiencies exceeding 1% while the AVT is above 70%. Provided is a simple approach to prepare UV harvesting TPVs with high efficiency and high transparency that are viable as single junction cells or as a component to multi-junction transparent and opaque cells.

Background

Wavelength selective TPVs focus on converting invisible light to electric power, while allowing the majority of visible light (VIS) to pass through. This functionality provides great potential for deployment in non-traditional applications. There are two primary parameters of interest to TPVs—power conversion efficiency (PCE) and average visible transmission (AVT). AVT is just as important as PCE, as it often defines the minimum threshold for deploying TPVs in new applications. In addition, color rendering index (CRI) is an important parameter for the adoptability of TPVs. Although the PCE of TPVs has been significantly improved to over 5% (with AVTs of about 50%), much work has focused on semitransparent PVs, even though many of the emerging applications are only enabled at the highest AVTs of about 70%.

Decreasing the absorption of visible light is key to improving the AVT and CRI of TPVs. A few reports have looked to selectively utilize ultraviolet (UV) light or near infrared (NIR) light absorption materials to produce the highest transparency devices. Further studies have reported a UV harvesting organic TPV achieving an AVT of 60% with a PCE of 1.5%, a series of organic salts with NIR harvesting properties and efficiency up to 0.9% with AVT of 60.4%, and organic-based NIR absorbing TPVs with PCEs between 0.9%-2.2% and AVT values (450-670 nm) of 62%-66%. In previous work, a UV wavelength-selective photovoltaic device with the AVT up to 73% was developed by exploiting the sharp wavelength cutoff enabled by tuning a perovskite bandgap right around the UV-visible cutoff. However, these previous efforts on developing highly transparent TPVs have shown that it is difficult to improve the TPV efficiency over 1% while the AVT simultaneously exceeds 70%, even though the theoretical limits for UV and UV/NIR harvesting TPVs are above 7% and 21%, respectively.

Figure 11:
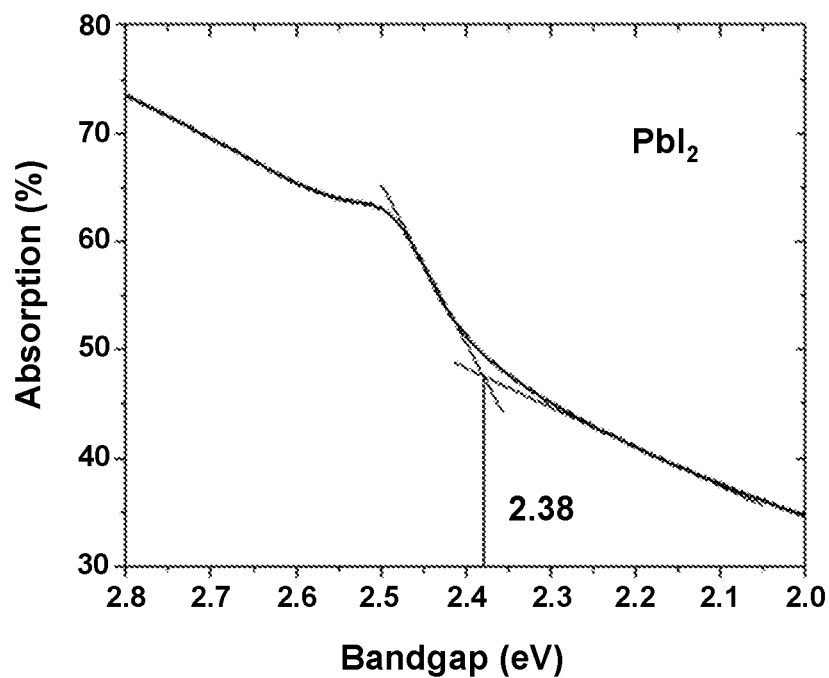
FIG. 11 is a plot for bandgap measurement from optical absorption of a $PbI_2$ film.

There are several types of metal halide semiconductors that exist, including bulk semiconductors and metal halide nanoclusters. The latter have been introduced in luminescent solar concentrators (LSC) and light-emitting diodes (LEDs) as a phosphorescent material, while the former have emerged as a byproduct from research on metal halide perovskite solar cells. Several metal halide semiconductors have been used as the light absorber in opaque solar cells, indicating the potential of metal halide materials in photovoltaic applications. For example, an InI-based solar cell (bandgap of 2.0 eV) has been reported. Although the device efficiency is only 0.4%, this demonstrates that InI is a viable photovoltaic material. Bismuth iodide (bandgap of 1.72 eV) has also been used in solar cells as the light harvest material and the efficiency of the photovoltaic devices has been shown up to 1.2%. However, since the bandgaps are in the visible range, these two metal halide materials are less suitable as a wavelength selective light absorber in TPVs. Stemming from research on lead halide perovskite solar cells, $PbI_2$ (one of the perovskite precursors) has been found to work as a photovoltaic material. While the bandgap of $PbI_2$ (2.4 eV) makes it less suitable for single-junction opaque cells as shown in FIG. 11, it has potential for selectively harvesting UV light for TPVs, particularly if the bandgap could be increased closer to 2.7-2.8 eV. Reports have demonstrated $PbI_2$ as the light absorber for the TPVs with an efficiency up to 0.75% and a corresponding AVT of 49%, but with a low CRI of 77. Accordingly, TPV devices with increased efficiency and transparency are desirable.

Here, metal halide based TPVs with an efficiency over 1% are demonstrated. The thickness and processing of the $PbI_2$ active layer is first optimized and chloride and bromide doping is systematically investigated to understand the ability to modulate the bandgap. It is demonstrated that such an approach will work with bulk metal halides (non-perovskite structures) and the impact on physical and optoelectronic properties is shown. While the optical properties vary smoothly with doping, there is a sharp drop in electronic properties with Br and Cl doping past 10%. Based on this optimization, the resulting metal halide TPVs show device PCEs up to 1.22% with an AVT of 70.7%. Initial device stability is studied to further understand the impact of compositional doping, where bromine doping is found to increase lifetime. This demonstrates that simple metal halide semiconductors are useful as light harvesting materials for TPVs with high efficiency at the highest transparencies and that bandgaps can be modulated to achieve ideal cutoffs. The low cost and simple processing technique of metal halides provides a potential approach for TPVs in a variety of applications.

Methods

Materials and Precursor Preparation: Dimethylformamide (DMF, anhydrous, 99.8%, Aldrich.), $PbI_2$ (99%, Aldrich.), $PbBr_2$ (99%, Aldrich.), $PbCl_2$ (98%, Aldrich), $C_{60}$ (99.9%, MER Corporation.), 2,9-dimethyl-4,7-diphenyl-1,10-phenanthroline (BCP, Lumtech.), and tris-(8-hydroxy-quinolinato)aluminium ($Alq_3$, 99.5%, Lumtech.) are used as received. Poly(3,4-ethylenedioxythiophene) polystyrene sulfonate (PEDOT, Clevios PVP Al 4083, 1.3 wt. %, Heraeus) is diluted to 10 vol. % with deionized water before use. To prepare the 1.0 M-$PbI_2$ precursor solution, 461 mg $PbI_2$ is added in 1.0 ml DMF. The solutions are then stirred for 1 hour and filtered with 0.45 μm PTFE filters. The various concentrations of $PbI_2$ solutions are prepared by diluting the 1 M-$PbI_2$ solutions with DMF.

Device Fabrication: PEDOT solutions are spin-coated onto pre-cleaned ITO substrates at 6000 rpm for 10 seconds and then annealed at 110° C. for 2 minutes. The lead halide precursor solution is spin-coated on top of PEDOT film at 6000 rpm for 7 seconds, and then moved quickly into a homemade vacuum chamber, evacuated to the mTorr range, and left in the chamber for 3 minutes. The substrates are then transferred to the hot plate and annealed at 80° C. for 2 minutes. The substrates are then moved into the evaporation chamber for deposition of $C_{60}$ (20 nm) and BCP (7.5 nm). Finally, a 5 nm thick silver electrode and 60 nm of $Alq_3$ is deposited by thermal evaporation at a base pressure of $3\times10^{-6}$ Torr through a shadow mask with a final measured device area of 4.85 mm². For the opaque device, a thermally 80 nm silver layer is deposited on the BCP layer as the electrode.

Measurement and Characterization: The thickness of the $PbI_2$ film is measured by spectroscopic ellipsometry (Wollam Vase). UV-VIS-NIR transmission and reflection spectra are collected using a dual beam PerkinElmer Lambda 800 spectrometer. No reference sample is utilized for the transmission measurement. The current density-voltage characteristics (J-V curves) are obtained using a Keithley 2420 source measurement unit under both dark and AM1.5 G solar simulation, where the light intensity is measured using a NREL-calibrated Si reference cell with KG5 filter (xenon arc lamp with the spectral-mismatch factor of 1.08±0.02 for the devices studied). Devices are scanned at a rate of 50 mV/s. EQE measurements are performed using a QTH lamp with a calibrated Si detector, monochromator, chopper, and lock-in amplifier. The IQE is estimated as IQE=EQE/(1−R−T). The J-V and EQE are measured on un-encapsulated devices/samples in ambient air.

Figure 12A:
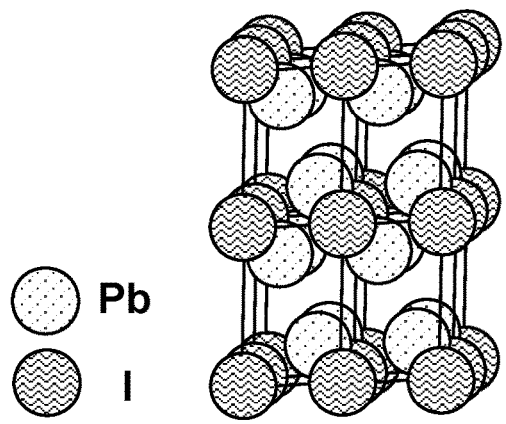
FIG. 12A shows the crystal structure of $PbI_2$.
Figure 12B:
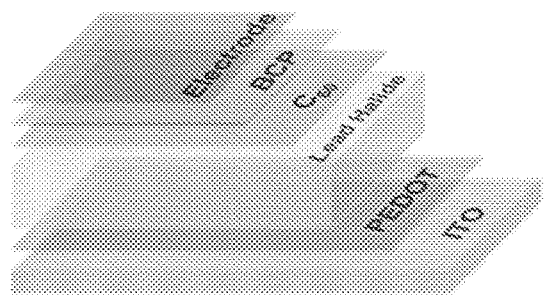
FIG. 12B shows the architecture of a lead halide solar cell.
Figure 12C:
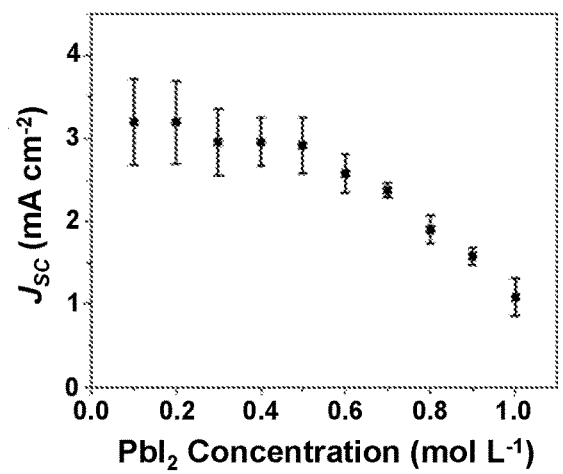
FIG. 12C is a graph showing the short-circuit current of opaque $PbI_2$ solar cells prepared by $PbI_2$ precursor solutions with various concentrations.
Figure 12D:
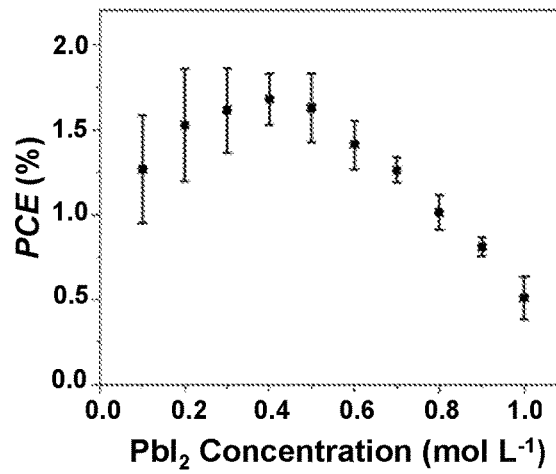
FIG. 12D is a graph showing the power conversion efficiency of opaque $PbI_2$ solar cells prepared by $PbI_2$ precursor solutions with various concentrations.
Figure 13:
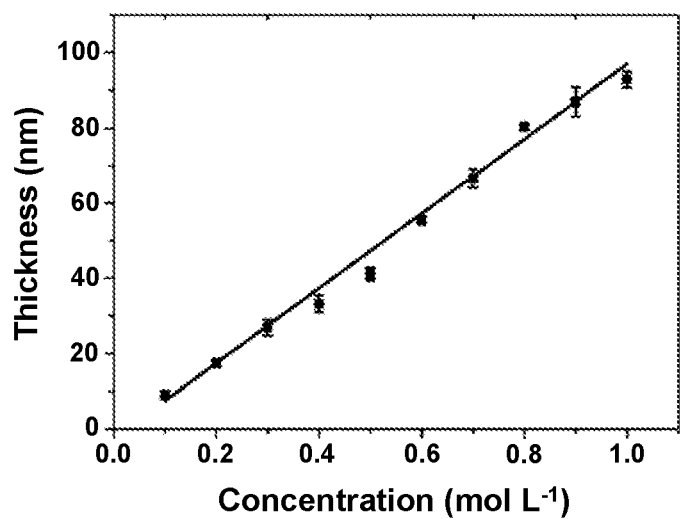
FIG. 13 is a graph showing $PbI_2$ film thickness as a function of concentration of $PbI_2$ precursor solutions.
Figures 14A, 14B:
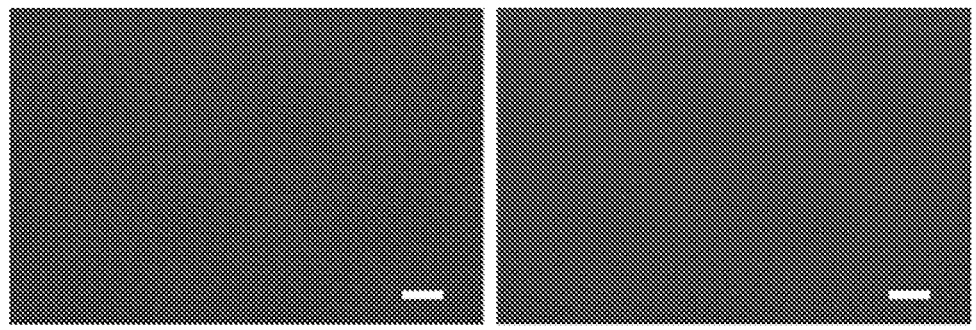
FIG. 14A is a scanning electron microscopy (SEM) image of a $PbI_2$ film prepared from a 0.1 M $PbI_2$ precursor solution. The scale bar is 1 μm.
FIG. 14B is a SEM image of a $PbI_2$ film prepared from a 0.2 M $PbI_2$ precursor solution. The scale bar is 1 μm.
Figures 14C, 14D:
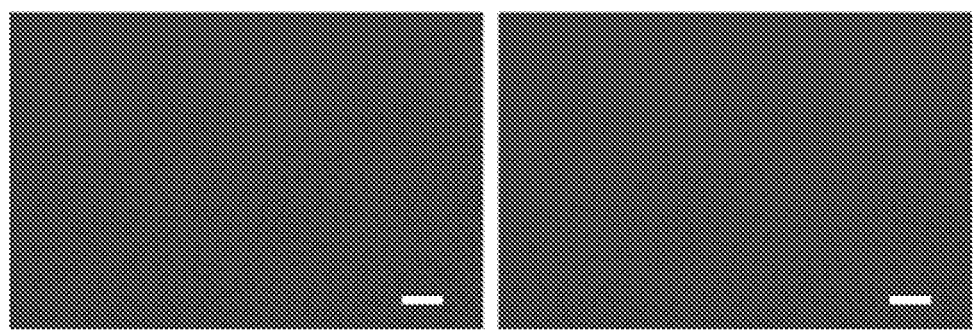
FIG. 14C is a SEM image of a $PbI_2$ film prepared from a 0.5 M $PbI_2$ precursor solution. The scale bar is 1 μm.
FIG. 14D is a SEM image of a $PbI_2$ film prepared from a 1 M $PbI_2$ precursor solution. The scale bar is 1 μm.

Results $PbI_2$ is a precursor material for lead halide perovskite films that has a hexagonal crystal structure. FIG. 12A shows $PbI_2$ films are deposited on substrates by spin coating or thermal evaporation, and $PBI_2$ film thickness is controlled by changing the concentration of precursor solutions or spin coating speed. The influence of $PbI_2$ film thickness on device performance is first investigated in opaque device structures. $PbI_2$ precursor solutions are prepared with concentrations ranging from 1 M to 0.1 M. The thickness of $PbI_2$ film increases from 9±1 nm to 93±2 nm as solution concentration increases from 0.1 M to 1.0 M as shown in FIG. 13. Since the processing atmosphere can significantly influence the morphology of $PbI_2$ films, the vacuum assistant method is used to prepare highly reproducible and smooth $PbI_2$ films. As seen in FIGS. 14A-14D, scanning electron microscopy (SEM) images show that the $PbI_2$ films are uniform and smooth with few pin holes. FIG. 12B shows a device architecture that is utilized, where a thin PEDOT layer acts as the hole transport layer and a 20 nm fullerene layer is deposited on the $PbI_2$ to act as the electron extraction layer. A thin BCP layer is deposited on the fullerene to make ohmic contact with an 80 nm silver electrode that is thermal evaporated. For the transparent devices, the 80 nm silver electrode is replaced with 5 nm-silver/60 nm-$Alq_3$ as the transparent electrode.

Figure 15A:
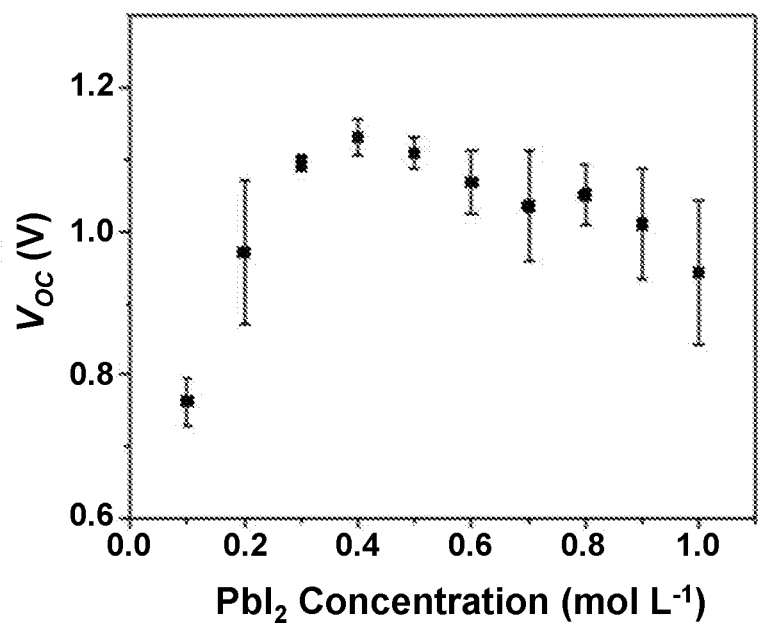
FIG. 15A is a graph showing the open-circuit voltage of opaque $PbI_2$ solar cells prepared by $PbI_2$ precursor solutions with various concentrations.
Figure 15B:
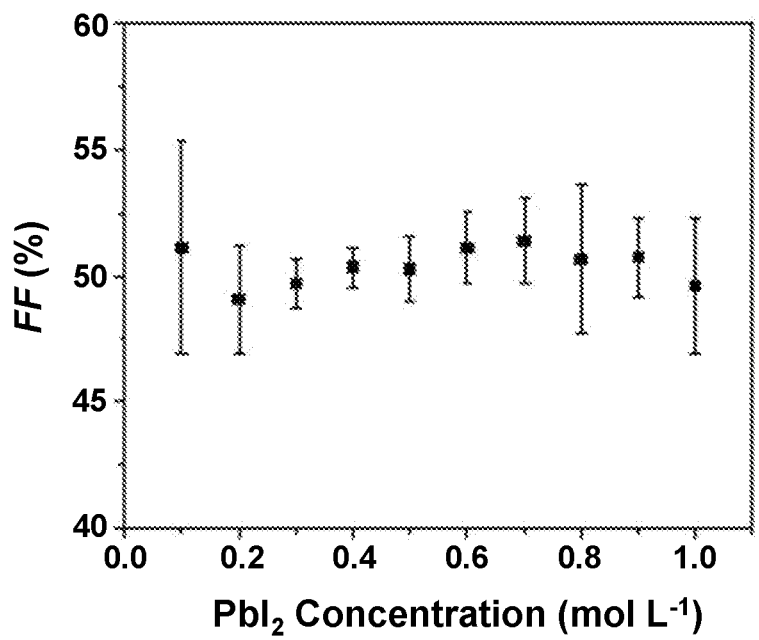
FIG. 15B is a graph showing the fill factor of opaque $PbI_2$ solar cells prepared by $PbI_2$ precursor solutions with various concentrations.

Device parameters of opaque cells are summarized in FIGS. 12A-12D and FIGS. 15A-15B. The device photocurrent drops following an increase of the $PbI_2$ film thickness. It can be inferred that the device series resistance increases with the $PbI_2$ film thickness and induces increased charge recombination due to modest charge collection lengths (or depletion widths) less than 40 nm. The increased series resistance also reduces the open-circuit voltage ($V_{OC}$) of the device, where the $V_{OC}$ of the thickest $PbI_2$ film is lower than 1.0 V as shown in FIG. 15A. In comparison, the $V_{OC}$ of the devices with a film thickness about 30 nm is generally 1.1 V and the highest $V_{OC}$ recorded is 1.17 V. The average PCE then shows a maximum of 1.68% at about 0.4 M. This result is utilized as a guide for TPV fabrication. While the aim is to exploit the sharp bandgap cutoff to more selectively harvest ultraviolet light, thicker $PbI_2$ films in some cases can decrease the transparency of TPV devices and color rendering due to tail state absorption. Thus, here, the concentration of $PbI_2$ precursor solutions is constrained below 0.3 M, resulting in a $PbI_2$ film thickness of less than 30 nm for TPV devices.

Figure 16A:
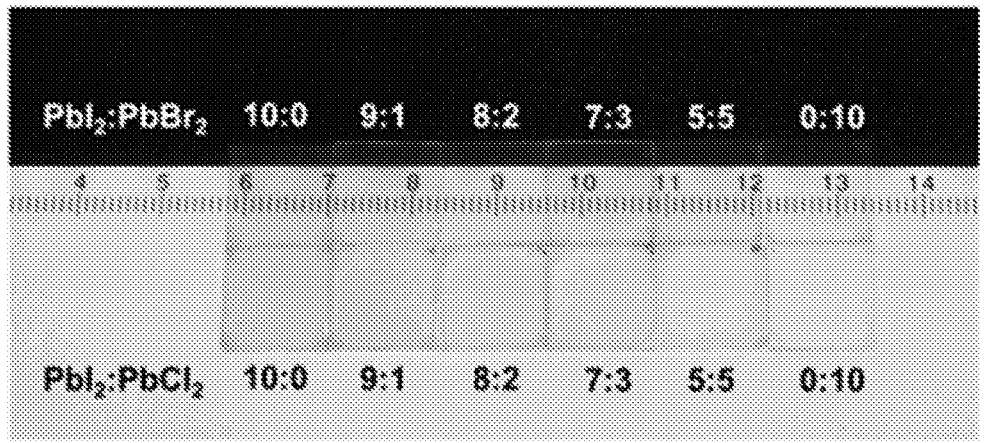
FIG. 16A is a photograph of lead halide films with various bromide or chloride doping ratios (the concentration of lead is 0.3 M).
Figure 16B:
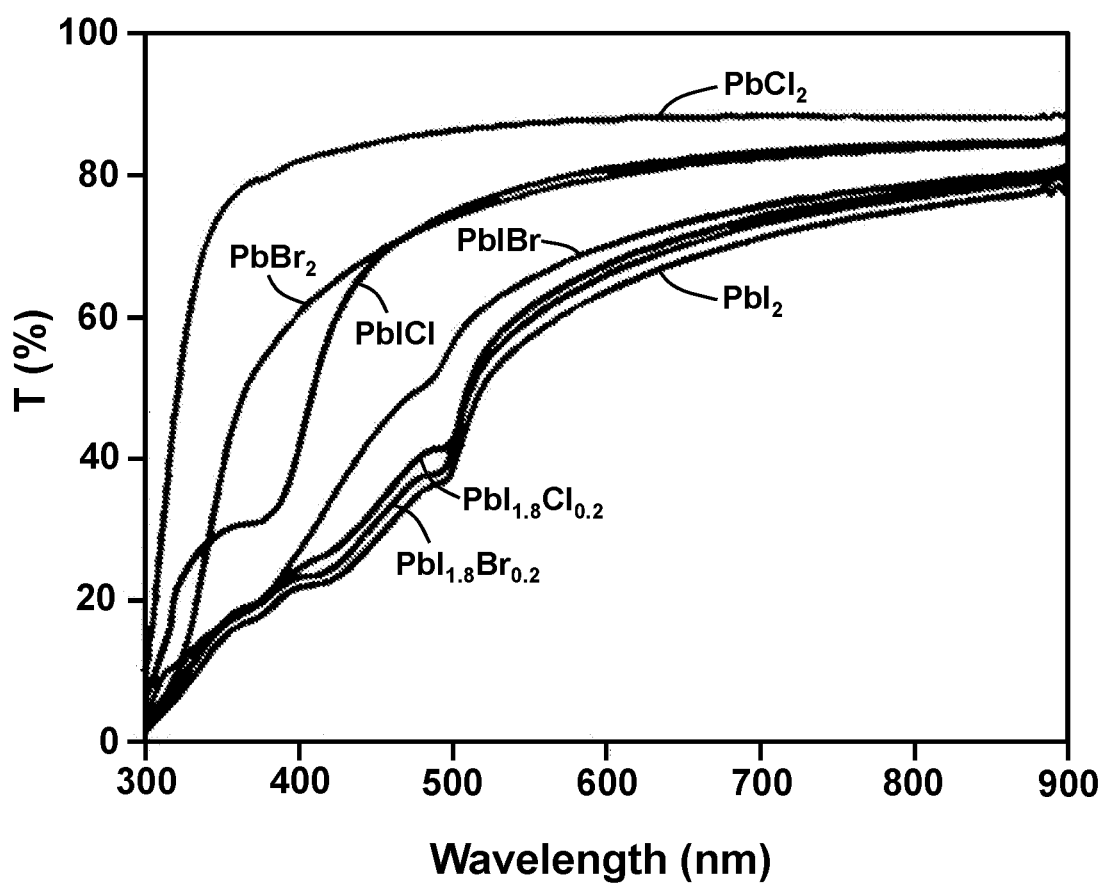
FIG. 16B is a graph showing transmission spectra of lead halide films with various bromide or chloride doping ratios (the concentration of lead is 0.3 M).
Figure 17A:
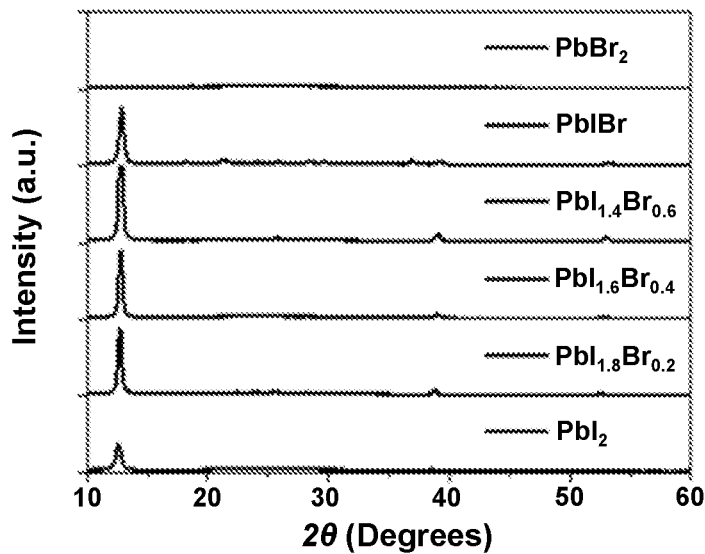
FIG. 17A shows x-ray diffraction (XRD) patterns of lead halide films doped by Br with various doping ratios.
Figure 17B:
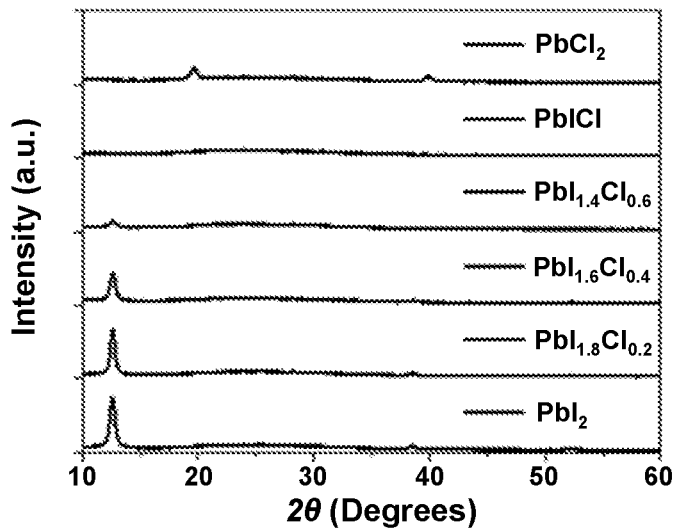
FIG. 17B shows XRD patterns of lead halide films doped by Cl with various doping ratios.
Figure 17C:
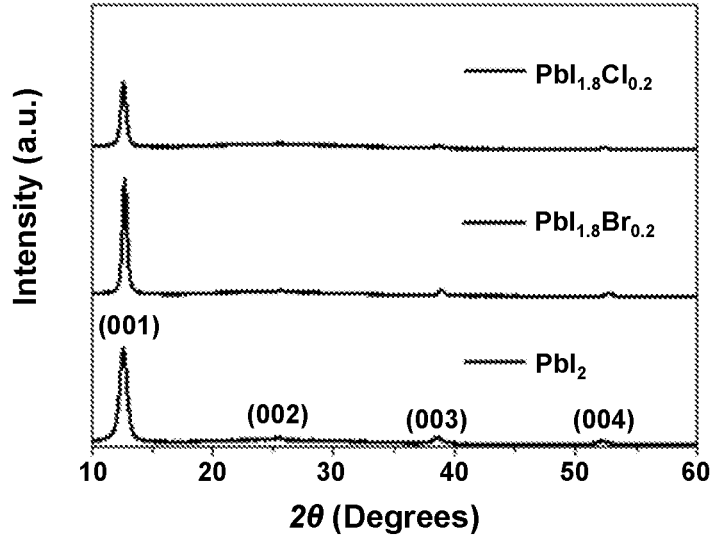
FIG. 17C shows XRD patterns of lead halide films with and without a 10% mole doping ratio of Br or Cl.
Figure 18A:
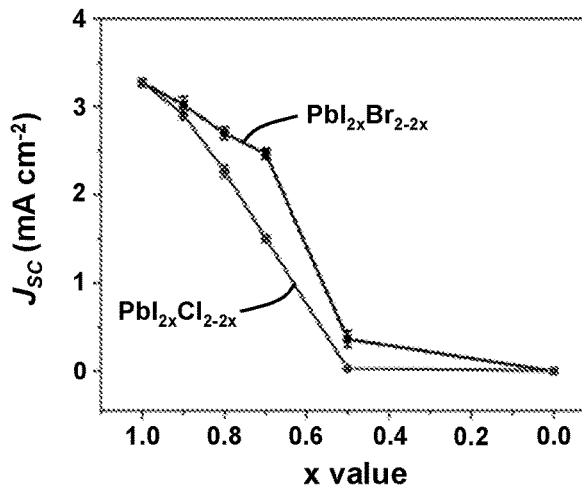
FIG. 18A is a graph showing short-circuit current density ($J_{SC}$) of opaque lead halide solar cells prepared by lead halide precursor solutions with various bromide or chloride doping ratios.
Figure 18B:
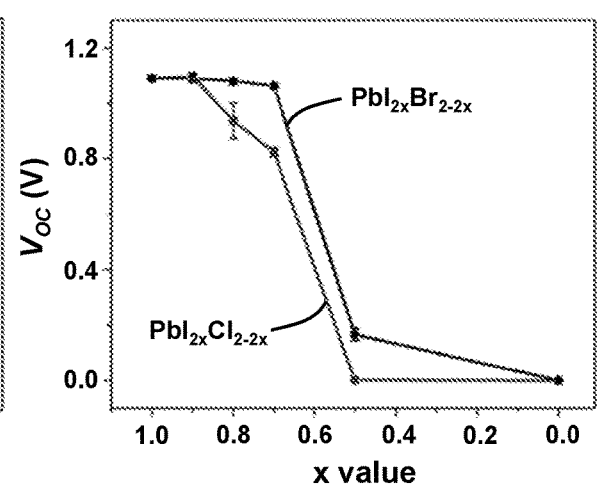
FIG. 18B is a graph showing open-circuit voltage ($V_{OC}$) of opaque lead halide solar cells prepared by lead halide precursor solutions with various bromide or chloride doping ratios.
Figure 18C:
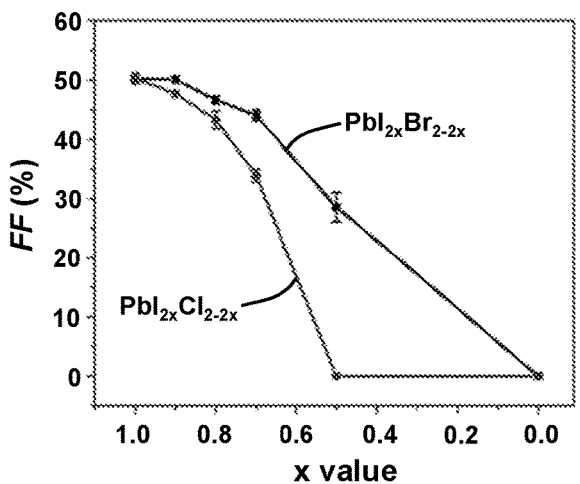
FIG. 18C is a graph showing fill factor (FF) of opaque lead halide solar cells prepared by lead halide precursor solutions with various bromide or chloride doping ratios.
Figure 18D:
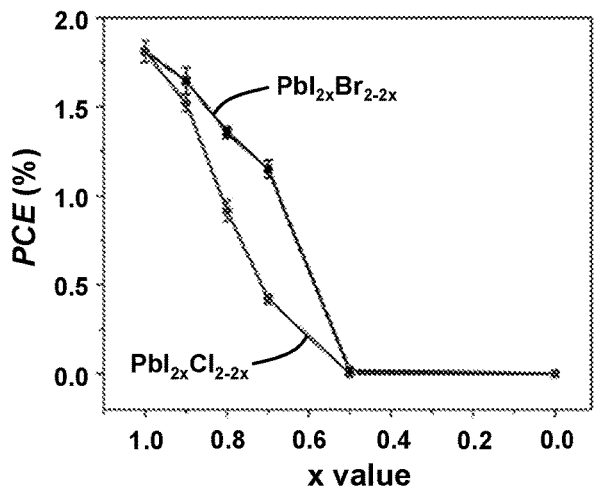
FIG. 18D is a graph showing power conversion efficiency (PCE) of opaque lead halide solar cells prepared by lead halide precursor solutions with various bromide or chloride doping ratios.

It is further demonstrated that the absorption range of lead halide materials unexpectedly can be readily modified by doping with various halide elements, analogous to perovskite films, despite the vastly different crystal structure (hexagonal versus perovskite). This is advantageous because it enables precise bandgap modification around the UV/VIS cutoff that is shown to be critical for the optimization of both PCE and AVT. FIG. 16A shows photographs of $PbI_2$ films with various bromide or chloride doping ratios. As Br or Cl doping increases, the light yellow color becomes clearer and lighter. Accordingly, the transparency of the films increases concomitantly as shown in FIG. 16B, where a $PbI_2$:$PbBr_2$ ratio of 10:0 has a yellow tint and a $PbI_2$:$PbBr_2$ ratio of 0:10 has virtually no tint. FIGS. 17A-17C provide X-ray diffraction (XRD) patterns of Br doped lead halide films and show that the diffraction intensities are enhanced with a molar doping ratio of 10-30%, which indicates that Br-doping contributes to improved film crystallization. However, the performance of the corresponding device shows a sharp reduction when the doping ratio increases above 10% for Cl doping and 30% for Br doping as shown in FIGS. 18A-18D. Subsequent TPV doping optimization is then performed with a doping limit of about 10% for both Cl and Br doping.

Figure 19A:
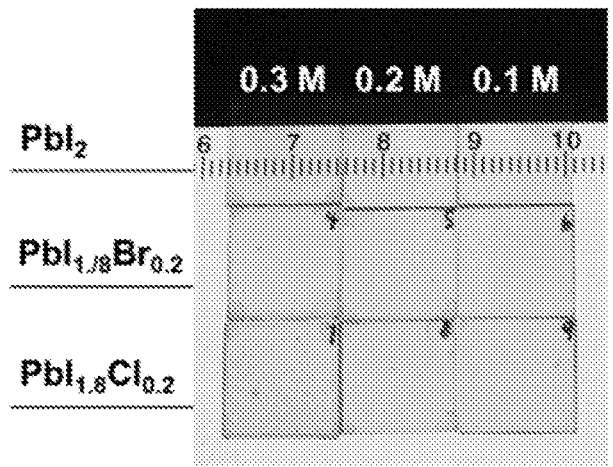
FIG. 19A is a photograph of lead halide TPVs.
Figure 19B:
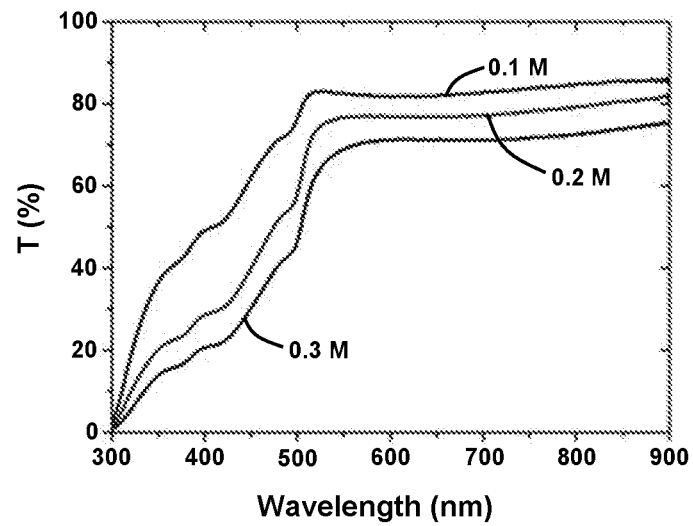
FIG. 19B shows transmission spectra of $PbI_2$ films prepared by $PbI_2$ precursor solutions with various concentrations.
Figure 19C:
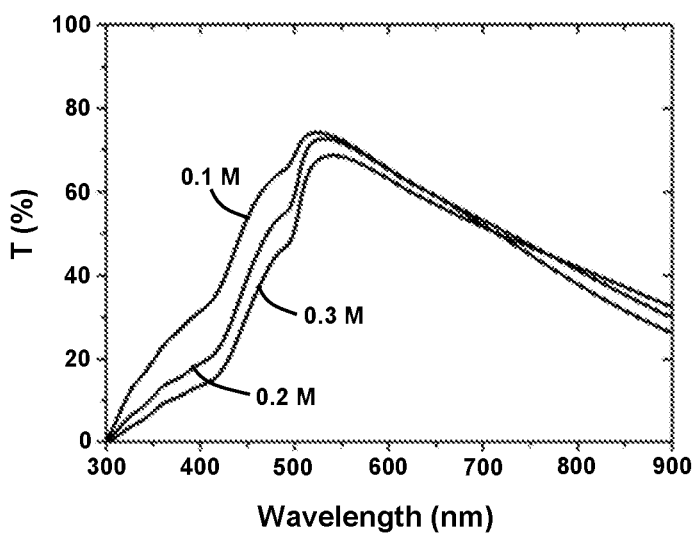
FIG. 19C shows transmission spectra of lead halide TPVs prepared by $PbI_2$ precursor solutions with various concentrations.
Figure 20A:
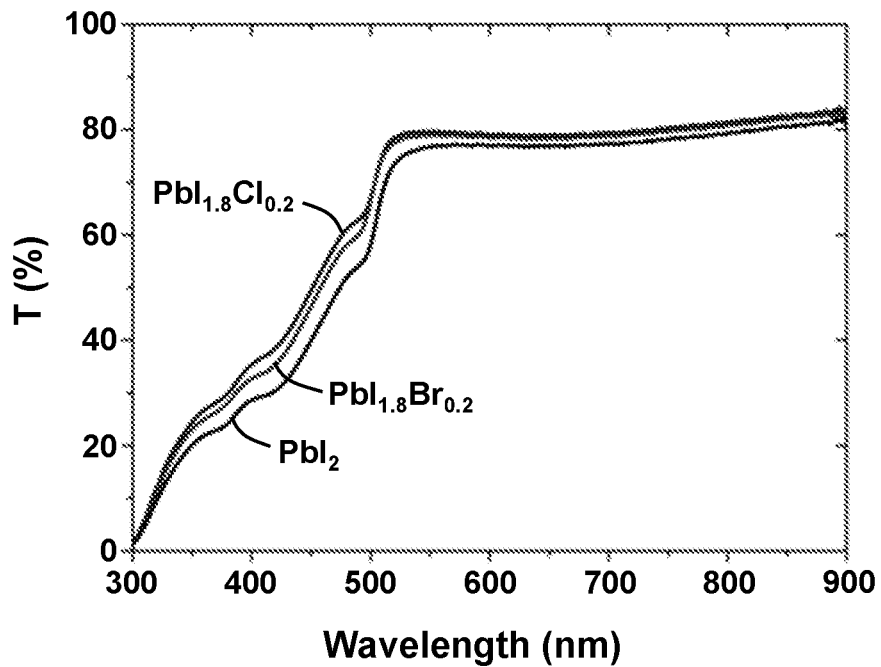
FIG. 20A shows transmission spectra of lead halide films prepared by 0.2 M lead halide precursor solutions with 10% bromide or chloride doping ratios.
Figure 20B:
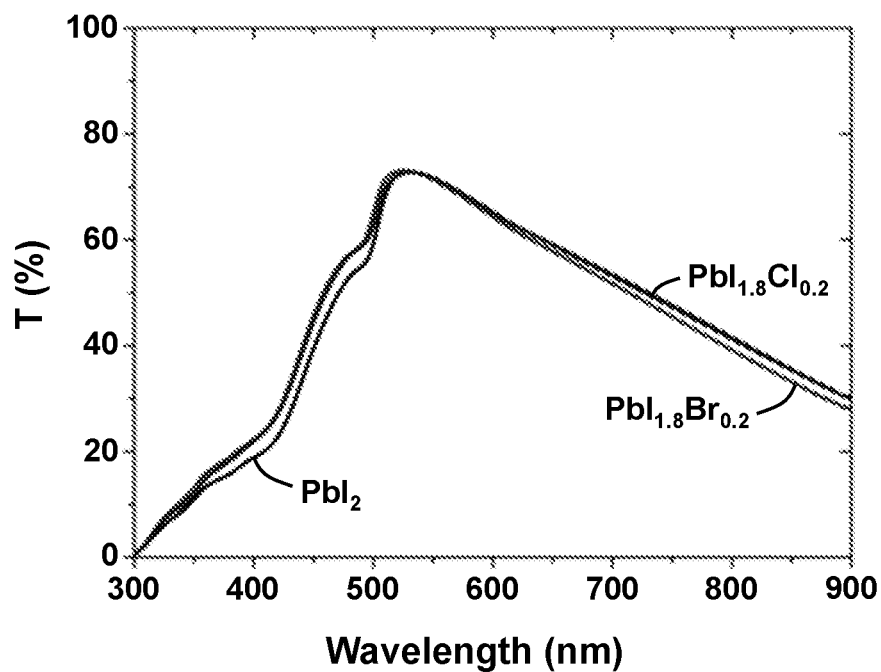
FIG. 20B shows transmission spectra of lead halide TPVs prepared by 0.2 M lead halide precursor solutions with 10% bromide or chloride doping ratios.

Lead halide TPVs are prepared with bromide or chloride doped $PbI_2$ precursor solutions (10%) with the various solution concentrations of 0.1 M, 0.2 M and 0.3 M. Photographs of the fully assembled (unpatterned) TPV devices are shown in FIG. 19A. Quantitative transparency parameters for the TPVs are summarized in Table 3, including AVT and CRI. FIGS. 19B and 19C show the transmission spectra of $PbI_2$ films and TPVs prepared from various concentrations of lead halide precursor solutions. FIG. 19B shows that the transmission of 0.1 M $PbI_2$ film exceeds 80% from 510 nm to 900 nm. Accordingly, the 0.3 M-$PbI_2$ film shows a peak transmission of about 70%, and as a result, the AVTs of the TPVs decrease from 68.4% to 63.5%, respectively, as shown in FIG. 19C. However, the highly clear and transparent films obtained from the vacuum assistant method still ensure that all the AVT values of the TPVs are greater than 60% (Table 3) with no measurable haze. The high transparency properties of undoped lead halide TPVs are also partially attributed to the ultrathin lead halide films, whereas the doped lead halides can maintain higher transparency for larger thickness ranges due to bandgaps closer to the 2.7-2.8 eV cutoff. For the various lead halide films with same precursor concentration, the transmission spectra are close to each other, especially for the transmission spectra of TPV devices as seen in FIGS. 20A-20B. For example, all of the transmission spectra of 0.2 M films are higher than 70% in the range from 515 nm to 900 nm, and the transmission spectra of TPV devices exhibit a peak at 520 nm, where the transmission exceeds 70%, resulting in AVTs around 68% for 0.2 M.

TABLE 3

Summary of photovoltaic and transparency parameters for lead halide TPVs.

| Device | [Pb] (mol L$^{-1}$) | J$_{SC}$ [mA cm$^{-2}$] | V$_{CC}$ [V] | FF [%] | PCE [%] | AVT [%] | CRI |
|---|---|---|---|---|---|---|---|
| PbI$_2$ | 0.1 | 1.94 ± 0.14 | 0.998 ± 0.03 | 51.9 ± 1.7 | 1.00 ± 0.06 | 65.9 | 87.5 |
|  | 0.2 | 2.02 ± 0.08 | 1.07 ± 0.02 | 55.0 ± 1.0 | 1.19 ± 0.06 | 69.2 | 89.3 |
|  | 0.3 | 1.88 ± 0.05 | 1.02 ± 0.04 | 53.2 ± 2.3 | 1.02 ± 0.06 | 70.7 | 91.3 |
| PbI$_{1.8}$Br$_{0.2}$ | 0.1 | 2.01 ± 0.06 | 1.02 ± 0.02 | 55.9 ± 1.6 | 1.15 ± 0.07 | 65.8 | 88.8 |
|  | 0.2 | 2.00 ± 0.05 | 1.05 ± 0.02 | 55.1 ± 1.5 | 1.16 ± 0.05 | 69.1 | 90.2 |
|  | 0.3 | 1.82 ± 0.04 | 0.966 ± 0.01 | 51.0 ± 3.6 | 0.929 ± 0.08 | 68.8 | 91.4 |
| PbI$_{1.8}$Cl$_{0.2}$ | 0.1 | 1.92 ± 0.09 | 1.03 ± 0.01 | 54.7 ± 0.9 | 1.09 ± 0.06 | 64.0 | 88.7 |
|  | 0.2 | 1.85 ± 0.09 | 1.07 ± 0.02 | 54.6 ± 1.5 | 1.08 ± 0.08 | 68.8 | 90.6 |
|  | 0.3 | 1.72 ± 0.02 | 0.889 ± 0.04 | 55.2 ± 1.8 | 0.846 ± 0.03 | 70.5 | 92.1 |

To investigate the optical properties, the reflection spectra of lead halide TPVs are further measured. The PbI$_{1.8}$Br$_{0.2}$ TPV device is used as a representative device for the optical properties of doped lead halide TPVs. FIG. 21A shows a photograph of a complete PbI$_{1.8}$Br$_{0.2}$ TPV device, which is taken under outdoor conditions. The lack of strong coloring is reflected by the high CRI value (greater than 90). Generally, a CRI value of 85-90 is the lower limit for acceptable color alteration to maintain a "natural color." FIG. 22A shows a photograph of a PbI$_{1.8}$Br$_{0.2}$ film on ITO and of a PbI$_{1.8}$Br$_{0.2}$ TPV device, and FIG. 22B shows corresponding transmission spectra of PbI$_{1.8}$Br$_{0.2}$ TPVs, where the drop in transmission between 510 nm and 900 nm compared to neat films is mainly caused by reflection (see FIG. 21B). Generally, an antireflection (AR) layer can reduce the optical loss by about 3-4% on each side of the device. With the addition of one AR coating applied on the glass side, the AVT of PbI$_{1.8}$Br$_{0.2}$ TPV increases from 67.5% to 69.1%. The AVTs of the 0.1 M-PbI$_2$ and 0.1 M-PbI$_{1.8}$Cl$_{0.2}$ TPVs then exceed 70%.

The EQE of the PbI$_{1.8}$Br$_{0.2}$ TPV device is also shown in FIG. 21B to analyze the necessary consistency checks. The device shows a maximum EQE up to 35% at 410 nm, so that the integrated photocurrent from the EQE spectrum is 1.78 mA cm$^{-2}$. Combined with a calculated spectral mismatch factor of 1.09, this integrated photocurrent agrees well with the short-circuit current density (J$_{SC}$) extracted from the J-V curve. Using the photon balance, the maximum IQE is calculated to be 70.1% at 465 nm by estimating the total absorption using the photon balance (A=1−T−R). Using the photon balance as a consistency check, the highest sum of (T+R+EQE) is lower than 1.0 at every wavelength, so that each of these independent measurements are unlikely to be overestimated.

The photovoltaic performance of lead halide TPVs as a function of doping and thickness (concentration) is also systematically studied. The photovoltaic parameters of TPVs are summarized in Table 3 and plotted in FIGS. 23A-23D. The results indicate that the TPV devices have good reproducibility and the majority of devices have PCE over 1%, except for a few devices prepared from 0.1 M precursor solutions. Overall, lead halide TPVs are improved in both device efficiency and transparency, with PCE up to 1.22% and an AVT above 70%. Thus, a TPV device with both an AVT over 70% and a PCE over 1% is reported. Moreover, by managing both absorption and reflection, the resulting CRI of the device is improved over the CRI of the film alone, so that the device also has a more neutral color.

Figure 23A:
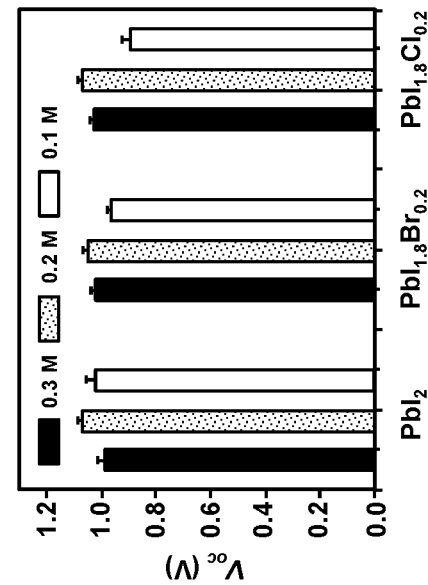
FIG. 23A shows short-circuit current densities ($J_{SC}$) for $PbI_2$ TPVs, $PbI_{1.8}Br_{0.2}$ TPVs, and $PbI_{1.8}Cl_{0.2}$ TPVs at 0.1 M, 0.2 M, and 0.3 M concentrations.
Figure 23C:
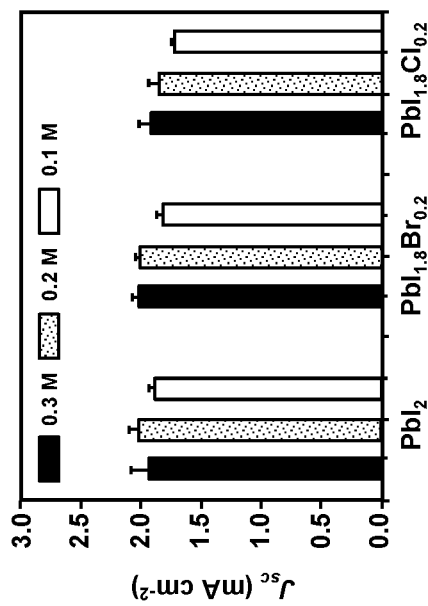
FIG. 23C shows power conversion efficiencies (PCE) for $PbI_2$ TPVs, $PbI_{1.8}Br_{0.2}$ TPVs, and $PbI_{1.8}Cl_{0.2}$ TPVs at 0.1 M, 0.2 M, and 0.3 M concentrations.
Figure 23B:
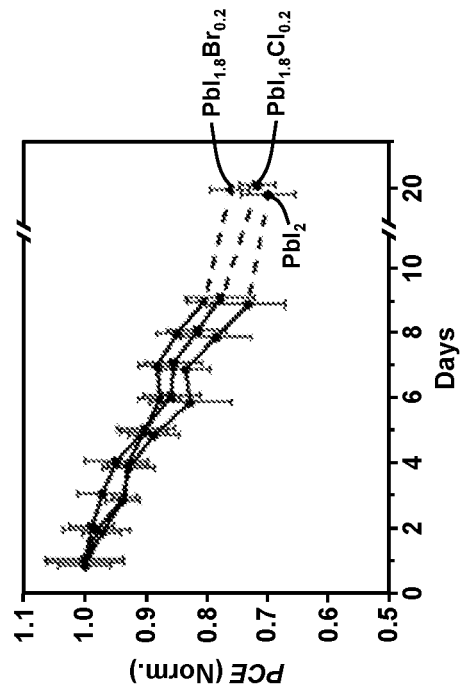
FIG. 23B shows open-circuit voltages ($V_{OC}$) for $PbI_2$ TPVs, $PbI_{1.8}Br_{0.2}$ TPVs, and $PbI_{1.8}Cl_{0.2}$ TPVs at 0.1 M, 0.2 M, and 0.3 M concentrations.
Figure 23D:
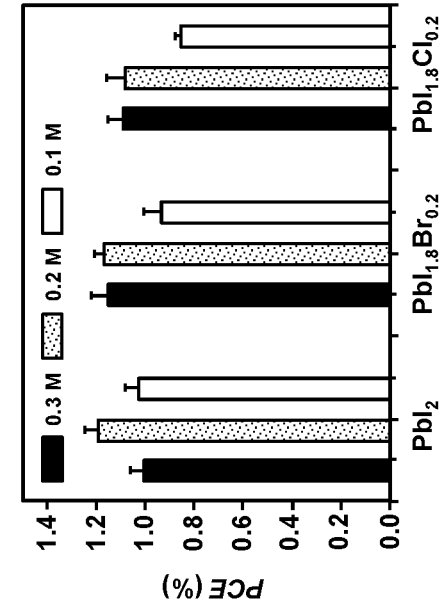
FIG. 23D is a graph showing the initial device stability test of $PbI_2$ TPVs, $PbI_{1.8}Br_{0.2}$ TPVs, and $PbI_{1.8}Cl_{0.2}$ TPVs.

The initial stability of un-encapsulated TPVs is also evaluated (see FIG. 23D). All the tested devices can maintain an efficiency over 80% of the initial performance after 150 hours and can maintain an efficiency over 60% after 500 hours. Among the TPVs studied, the PbI$_{1.8}$Br$_{0.2}$ device shows slightly enhanced stability during the test. This is similar to the results seen with halide perovskites, where Br doping and analogs typically tend to be more stable (particularly in air) over purely iodide based compositions. The improvement of film crystallization also contributes to the stability of Br doped TPV device (see FIG. 17C). Good encapsulation methods may further enhance device lifetimes well beyond these initial encapsulated measurements.

In summary, a series of lead halide TPV devices with both high efficiency and transparency is demonstrated. The thickness of the lead halide layer is systematically optimized. The bandgap and absorption of lead halide films are also finely tuned by doping the chloride and bromide into the pure PbI$_2$. While the doping range is limited by sharp device performance reductions beyond 10% for Cl doping and 30% for Br doping, this demonstrates that bandgap tunability is achievable in these materials. Following comprehensive optimization, the lead halide TPVs are shown to achieve a PCE over 1.0%, while the AVT exceeds 70% and the CRI exceeds 90. This is one of the highest device efficiencies reported at the highest transparency and provides a path to higher performance TPVs and multi-junction TPVs using additional metal halides.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A transparent photovoltaic cell comprising:
   a first visibly transparent electrode;
   a visibly transparent uniform active layer comprising a light absorbing active material that has a bandgap greater than or equal to about 2.75 eV, the visibly transparent uniform active layer including a halide perovskite, a metal halide, or both a halide perovskite and a metal halide; and
   a second visibly transparent electrode,
   wherein the visibly transparent uniform active layer is disposed between the first visibly transparent electrode and the second visibly transparent electrode, wherein the entire transparent photovoltaic cell has an average visible transparency of greater than or equal to about 60%, and wherein absorption peaks for all light absorbing active materials in the transparent photovoltaic cell are at a wavelength of less than or equal to about 450 nm.

2. The transparent photovoltaic cell according to claim 1, wherein the light absorbing active material has a bandgap greater than or equal to about 2.75 eV and less than or equal to about 3.2 eV.

3. The transparent photovoltaic cell according to claim 1, wherein the light absorbing active material is substantially nonabsorbent to light having a wavelength of greater than or equal to about 450 nm.

4. The transparent photovoltaic cell according to claim 1, wherein the transparent photovoltaic cell has a peak reflectance of greater than about 15% at wavelengths greater than or equal to about 650 nm to less than or equal to about 5000 nm.

5. The transparent photovoltaic cell according to claim 1, wherein the light absorbing active material is the halide perovskite.

6. The transparent photovoltaic cell according to claim 5, wherein the halide perovskite comprises nanocrystalline halide perovskite.

7. The transparent photovoltaic cell according to claim 5, wherein the halide perovskite has the formula $ABX_3$, where A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X is a halide or a combination of halides.

8. The transparent photovoltaic cell according to claim 7, wherein the halide perovskite comprises Cl and at least one other halide.

9. The transparent photovoltaic cell according to claim 1, wherein the light absorbing active material is the metal halide.

10. The transparent photovoltaic cell according to claim 9, wherein the metal halide comprises at least one of $PbI_2$, $PbCl_2$, $PbBr_2$, $PbI_xBr_{(1-x)}$, $PbI_xCl_{(1-x)}$, $PbBr_xCl_{(1-x)}$, $SnI_2$, $SnCl_2$, $SnBr_2$, $SnI_xBr_{(1-x)}$, $SnI_xCl_{(1-x)}$, $SnBr_xCl_{(1-x)}$, $GeI_2$, $GeCl_2$, $GeBr_2$, $GeI_xBr_{(1-x)}$, $GeI_xCl_{(1-x)}$, $GeBr_xCl_{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI_3$, $A_2TiI_6$, $A_2TiCl_6$, and $A_2TiBr_6$, where A is an alkali metal, an organic cation, or a combination thereof, and $0 \leq x \leq 1$.

11. The transparent photovoltaic cell according to claim 1, wherein the transparent photovoltaic cell transmits visible light and has an average visible transparency of greater than or equal to about 70%.

12. The transparent photovoltaic cell according to claim 1, wherein the transparent photovoltaic cell has a color rendering index of greater than about 80 referenced to an air mass 1.5 global (AM 1.5G) solar spectrum.

13. The transparent photovoltaic cell according to claim 1, wherein the first visibly transparent electrode is a visibly transparent anode and the second visibly transparent electrode is a visibly transparent cathode.

14. The transparent photovoltaic cell according to claim 1, further comprising:

an adjunct layer disposed between the first visibly transparent electrode and the visibly transparent uniform active layer, wherein the adjunct layer is an electron transport layer, an electron extraction layer, a hole blocking layer, or a buffer layer.

15. The transparent photovoltaic cell according to claim 1, further comprising:

an adjunct layer disposed between the visibly transparent uniform active layer and the second visibly transparent electrode, wherein the adjunct layer is an electron transport layer or an electron extraction layer that provides an ohmic contact between the visibly transparent uniform active layer and the second visibly transparent electrode.

16. The transparent photovoltaic cell according to claim 15, wherein the adjunct layer comprises at least one of a fullerene, ZnO, $TiO_2$, NiO, $MoO_3$, a conductive nanotube, and a conductive nanoparticle.

17. The transparent photovoltaic cell according to claim 1, wherein the second visibly transparent electrode comprises a transparent conducting oxide, a nanowire mesh, conducting oxide nanoparticles, conductive nanotubes, a thin metal layer, or a combination thereof.

18. The transparent photovoltaic cell according to claim 1, wherein the second visibly transparent electrode comprises a thin metal layer comprising silver (Ag) and a conductive layer comprising aluminum tris(8-hydroxyquinolinate) ($Alq_3$) or indium tin oxide (ITO), wherein the thin metal layer is disposed between the visibly transparent uniform active layer and the conductive layer.

19. The transparent photovoltaic cell according to claim 1, further comprising:

a visibly transparent substrate disposed on the first visibly transparent electrode, wherein the visibly transparent substrate comprises glass, a rigid polymer, or a flexible polymer.

20. The transparent photovoltaic cell according to claim 1, wherein the transparent photovoltaic cell has a power conversion efficiency greater than or equal to about 0.3%.

21. The transparent photovoltaic cell according to claim 1, wherein the transparent photovoltaic cell has an external quantum efficiency at any wavelength less than about 450 nm of greater than or equal to about 20%.

22. The transparent photovoltaic cell according to claim 1, wherein the transparent photovoltaic cell does not include an additional active layer having a bandgap of less than 2.75 eV.

23. The transparent photovoltaic cell according to claim 1, wherein the transparent photovoltaic cell does not include an additional active layer with an external quantum efficiency greater than about 10% at wavelengths greater than about 450 nm.

24. The transparent photovoltaic cell according to claim 1, wherein the transparent photovoltaic cell is configured as a tandem structure wherein the transparent photovoltaic cell is joined to at least one subcell via a recombination zone.

25. The transparent photovoltaic cell according to claim 1, wherein the visibly transparent uniform active layer is smooth.

26. The transparent photovoltaic cell according to claim 1, wherein the visibly transparent uniform active layer is free of pin holes over a 5 μm×5 μm area.

27. The transparent photovoltaic cell according to claim 1, wherein the transparent photovoltaic cell transmits visible light and has an average visible transparency of greater than or equal to about 65%.

28. The transparent photovoltaic cell according to claim 1, wherein the transparent photovoltaic cell has an external quantum efficiency of greater than or equal to 20% at any wavelength greater than 375 nm to less than 450 nm.

29. The transparent photovoltaic cell according to claim 1, wherein the transparent photovoltaic cell has a peak external quantum efficiency of greater than or equal to 20% at a wavelength less than 450 nm.

30. The transparent photovoltaic cell according to claim 1, wherein the transparent photovoltaic cell has a peak external quantum efficiency of greater than or equal to 30% at a wavelength less than 450 nm.

31. The transparent photovoltaic cell according to claim 1, wherein the light absorbing active material is a halide perovskite, wherein the halide perovskite comprises nanocrystalline halide perovskite having the formula $ABX_3$, where: A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X includes at least two kinds of halides.

32. The transparent photovoltaic cell according to claim 1, wherein the light absorbing active material is the metal halide, the metal halide having the formula $BX_2$, B is Pb, Sn, Ge, Cu, Sr, Ti, Mn, Bi, Zn, or a combination thereof, and X is a halogen or a combination of halogens.

33. A transparent photovoltaic cell comprising:
a substrate;
a first electrode;
a uniform active layer comprising a light absorbing active material that only absorbs ultraviolet (UV) light having a wavelength of less than about 450 nm, the light absorbing active material being either:
a halide perovskite, or
a metal halide; and
a second electrode,
wherein the first electrode is located between the substrate and the uniform active layer and the uniform active layer is located between the first electrode and the second electrode,
wherein each of the substrate, the first electrode, the uniform active layer, and the second electrode are visibly transparent, such that the transparent photovoltaic cell has an average visible transparency of greater than or equal to about 50%, and
wherein the transparent photovoltaic cell is configured to have an open circuit voltage of greater than 1.0 V.

34. The transparent photovoltaic cell according to claim 33, further comprising:
a first visibly transparent adjunct layer located between the first electrode and the uniform active layer; and
a second visibly transparent adjunct layer located between the uniform active layer and the second electrode,
wherein the first visibly transparent adjunct layer is an electron transport layer, an electron extraction layer, a hole blocking layer, or a buffer layer, and the second visibly transparent adjunct layer is an electron transport layer or an electron extraction layer.

35. The transparent photovoltaic cell of claim 33, wherein the open circuit voltage is greater than 1.1 V.

36. A transparent photovoltaic cell comprising:
a first visibly transparent electrode;
a second visibly transparent electrode; and
a visibly transparent uniform active layer disposed between the first visibly transparent electrode and the second visibly transparent electrode, the visibly transparent uniform active layer comprising a light absorbing active material that only absorbs light having a wavelength of less than about 450 nm and that is substantially nonabsorbent to light having a wavelength of greater than or equal to about 450 nm,
wherein the light absorbing active material is either:
a halide perovskite having the formula $ABX_3$, where A is methylammonium (MA), formamidinium (FA), ethanediammonium (EA), iso-propylammonium, dimethylammonium, guanidinium, piperidinium, pyridinium, pyrrolidinium, imidazolium, t-butylammonium, Na, K, Rb, Cs, or a combination thereof; B is Pb, Sn, Ge, Cu, Sr, Ti, Mn, Bi, Zn, or a combination thereof; and X is a halide or a combination of halides, or
a metal halide comprising at least one of $PbI_2$, $PbCl_2$, $PbBr_2$, $PbI_xBr_{(1-x)}$, $PbI_xCl_{(1-x)}$, $PbBr_xCl_{(1-x)}$, $SnI_2$, $SnCl_2$, $SnBr_2$, $SnI_xBr_{(1-x)}$, $SnI_xCl_{(1-x)}$, $SnBr_xCl_{(1-x)}$, $GeI_2$, $GeCl_2$, $GeBr_2$, $GeI_xBr_{(1-x)}$, $GeI_xCl_{(1-x)}$, $GeBr_xCl_{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI_3$, $A_2TiI_6$, $A_2TiCl_6$, and $A_2TiBr_6$,
where A is an alkali metal, an organic cation, or a combination thereof, and
wherein all light absorbing active materials in the transparent photovoltaic cell only absorb light having a wavelength of less than about 450 nm and are substantially nonabsorbent to light having a wavelength of greater than or equal to about 450 nm.

37. The transparent photovoltaic cell according to claim 36, wherein the transparent photovoltaic cell is a rigid display screen, a flexible display screen, a watch crystal, an automotive glass, a smart window, an autonomous electrochromic window, or an architectural glass.

38. The transparent photovoltaic cell according to claim 37, wherein the transparent photovoltaic cell is integrated into a multijunction photovoltaic cell.

* * * * *